(12) United States Patent
Kim et al.

(10) Patent No.: US 10,790,303 B2
(45) Date of Patent: *Sep. 29, 2020

(54) INTEGRATED ASSEMBLIES HAVING CHARGE-TRAPPING MATERIAL ARRANGED IN VERTICALLY-SPACED SEGMENTS, AND METHODS OF FORMING INTEGRATED ASSEMBLIES

(71) Applicant: Micron Technology, Inc., Boise, ID (US)

(72) Inventors: Woohee Kim, Seoul (KR); John D. Hopkins, Meridian, ID (US); Changhan Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,560

(22) Filed: Feb. 18, 2020

(65) Prior Publication Data

US 2020/0185413 A1 Jun. 11, 2020

Related U.S. Application Data

(63) Continuation of application No. 16/162,672, filed on Oct. 17, 2018, now Pat. No. 10,593,695.

(51) Int. Cl.
*H01L 21/28* (2006.01)
*H01L 21/02* (2006.01)
(Continued)

(52) U.S. Cl.
CPC .. *H01L 27/11582* (2013.01); *H01L 21/02236* (2013.01); *H01L 27/1157* (2013.01);
(Continued)

(58) Field of Classification Search
CPC ......... H01L 27/11582; H01L 29/40114; H01L 29/40117; H01L 29/4234; H01L 21/02236; H01L 29/1037; H01L 27/1157
See application file for complete search history.

(56) References Cited

U.S. PATENT DOCUMENTS 9,985,049 B1 * 5/2018 Sandhu ............ H01L 27/11556
10,083,981 B2    9/2018 Daycock et al.
(Continued)

*Primary Examiner* — Kyoung Lee
(74) *Attorney, Agent, or Firm* — Wells St. John P.S.

(57) ABSTRACT

Some embodiments include a memory array having a vertical stack of alternating insulative levels and wordline levels. The wordline levels include conductive wordline material having terminal ends. Charge blocking material is along the terminal ends of the conductive wordline material and has first vertical faces. The insulative levels have terminal ends with second vertical faces. The second vertical faces are laterally offset relative to the first vertical faces. Charge-trapping material is along the first vertical faces, and extends partially along the second vertical faces. The charge-trapping material is configured as segments which are vertically spaced from one another by gaps. Charge-tunneling material extends along the segments of the charge-trapping material. Channel material extends vertically along the stack, and is spaced from the charge-trapping material by the charge-tunneling material. The channel material extends into the gaps. Some embodiments include methods of forming integrated assemblies.

20 Claims, 29 Drawing Sheets

(51) Int. Cl.
  *H01L 27/11582*  (2017.01)
  *H01L 29/10*  (2006.01)
  *H01L 27/1157*  (2017.01)
  *H01L 29/423*  (2006.01)

(52) U.S. Cl.
  CPC .... *H01L 29/1037* (2013.01); *H01L 29/40114* (2019.08); *H01L 29/40117* (2019.08); *H01L 29/4234* (2013.01)

(56) References Cited

U.S. PATENT DOCUMENTS

| | | |
|---|---|---|
| 10,164,009 B1 | 12/2018 | Carlson |
| 10,438,962 B2 | 10/2019 | Kim |
| 10,446,572 B2 | 10/2019 | Carlson |
| 10,453,855 B2 | 10/2019 | Carlson et al. |
| 10,497,715 B2 | 12/2019 | Kim et al. |
| 2016/0099323 A1* | 4/2016 | Hopkins ........... H01L 29/66825 257/321 |
| 2018/0219017 A1 | 8/2018 | Goda et al. |
| 2019/0198509 A1 | 6/2019 | Kim |

\* cited by examiner

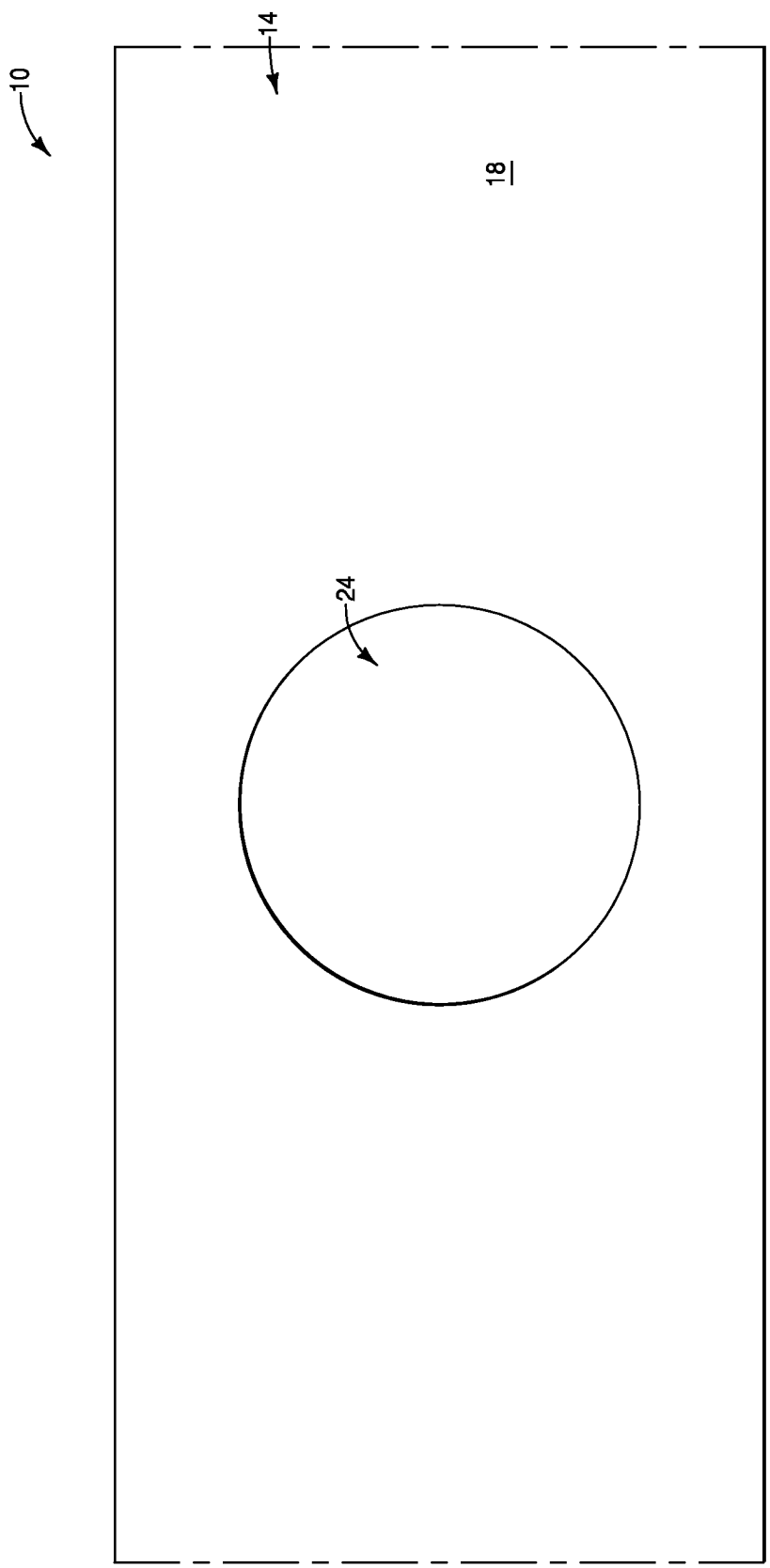

(A)

(B)

(C)

(D)

(E)

(F)

(G)

INTEGRATED ASSEMBLIES HAVING CHARGE-TRAPPING MATERIAL ARRANGED IN VERTICALLY-SPACED SEGMENTS, AND METHODS OF FORMING INTEGRATED ASSEMBLIES

RELATED PATENT DATA

This patent resulted from a continuation of U.S. patent application Ser. No. 16/162,672 filed Oct. 17, 2018, which is hereby incorporated by reference herein.

TECHNICAL FIELD

Integrated assemblies having charge-trapping material arranged in vertically-spaced segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 6A is a top-down view of a region of the assembly of FIG. 6.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and can enable charge migration between the cells. The charge migration between memory cells may lead to data retention problems. Some embodiments include NAND architectures having breaks in the charge-trapping material in regions between memory cells; and such breaks may impede migration of charge between memory cells. The charge-trapping material of such NAND architectures may be configured as vertically-spaced segments.

Tunneling-material is provided between the channel material and the charge-storage material, and the charge passing between the channel material and the charge-storage material passes through the tunneling material. In some embodiments, the tunneling material comprises nitrogen-containing material corresponding to one or both of silicon nitride and silicon oxynitride. The tunneling material may wrap partially around the segments of the charge-trapping material. The nitrogen-containing material of the tunneling material may or may not extend across the breaks between the vertically-stacked segments of the charge-storage material. Example embodiments are described with reference to FIGS. 5-28.

Figure 1:
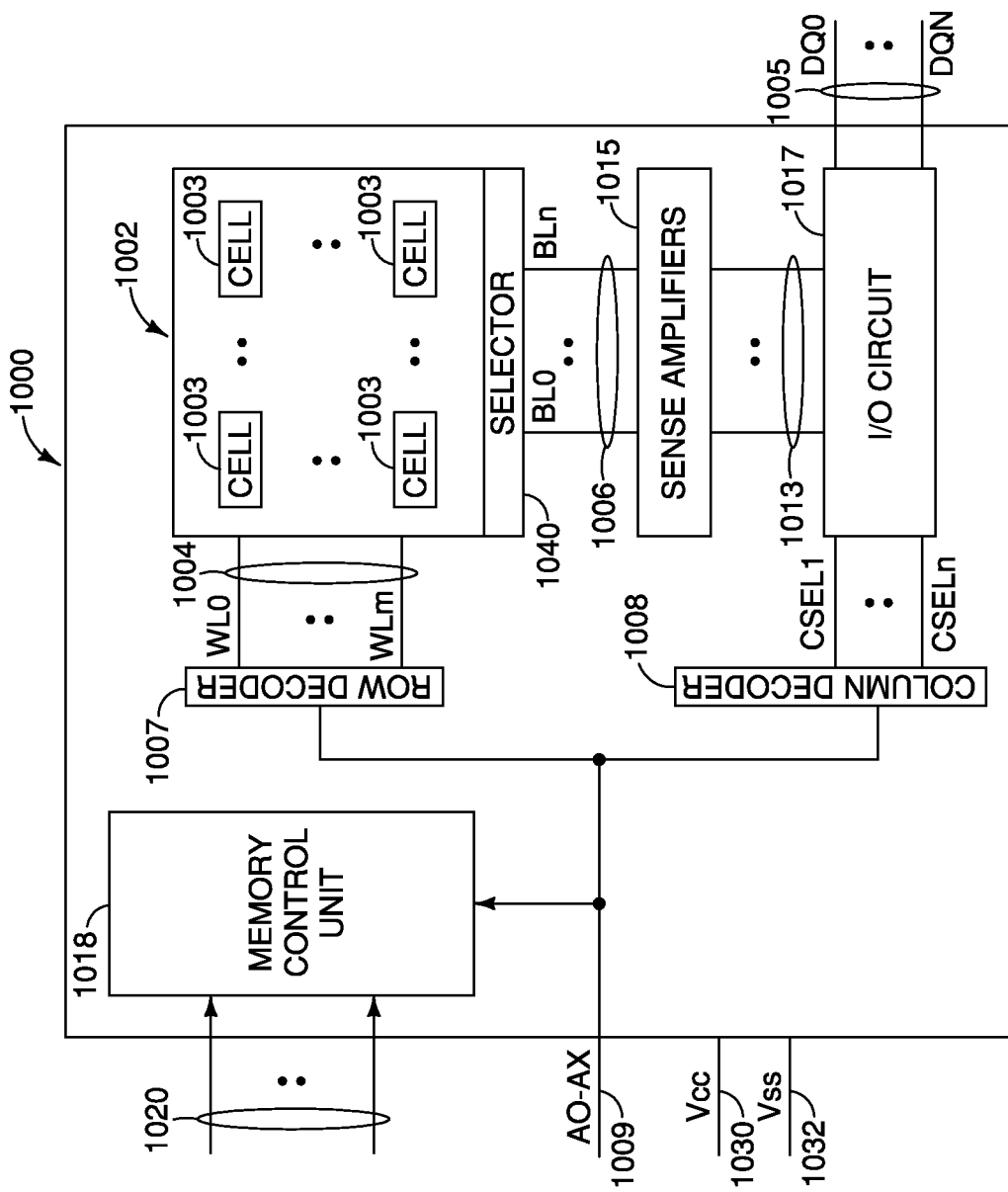
FIG. 1 shows a block diagram of a prior art memory device having a memory array with memory cells.
Figure 2:
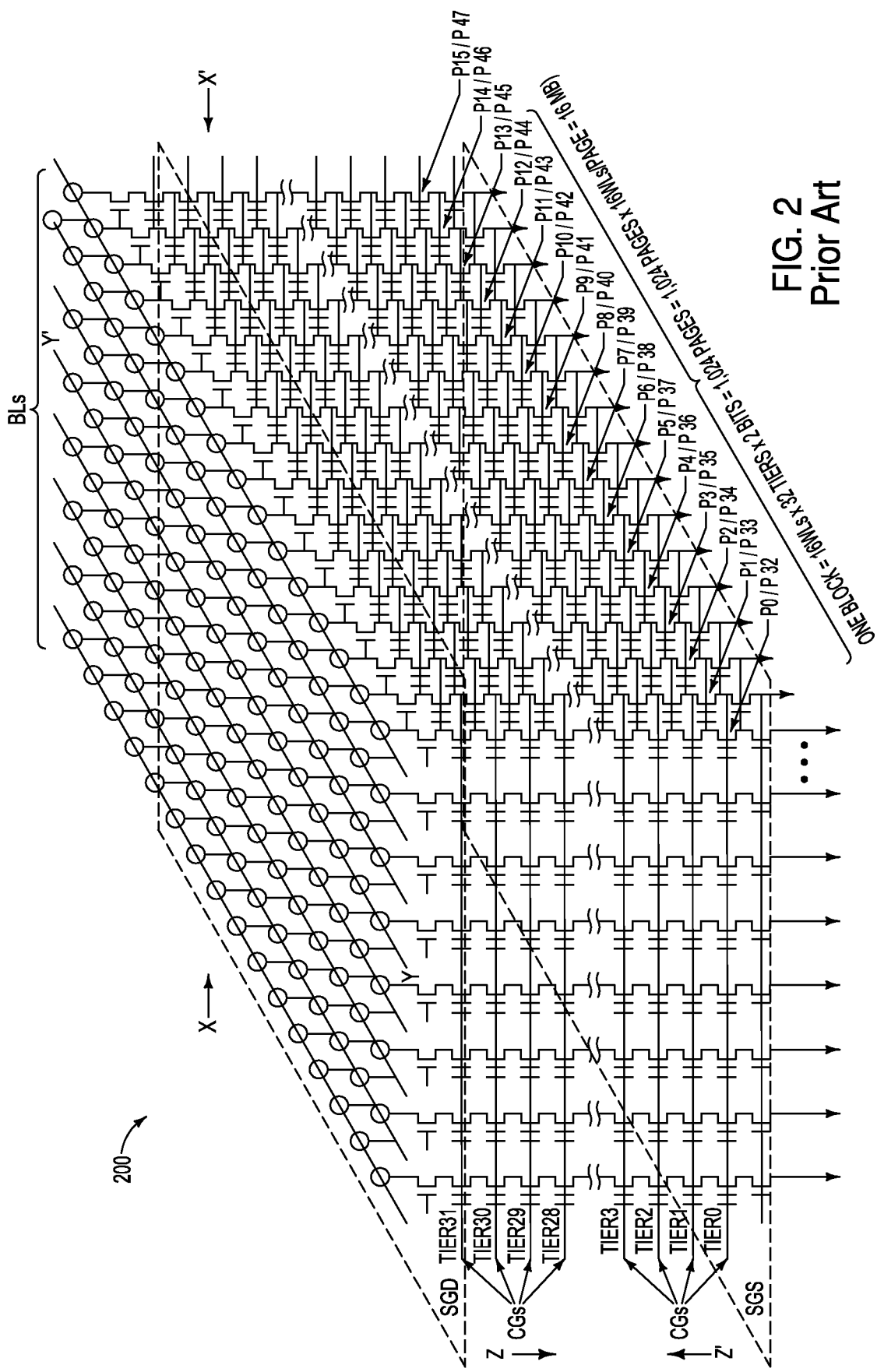
FIG. 2 shows a schematic diagram of the prior art memory array of FIG. 1 in the form of a 3D NAND memory device.
Figure 3:
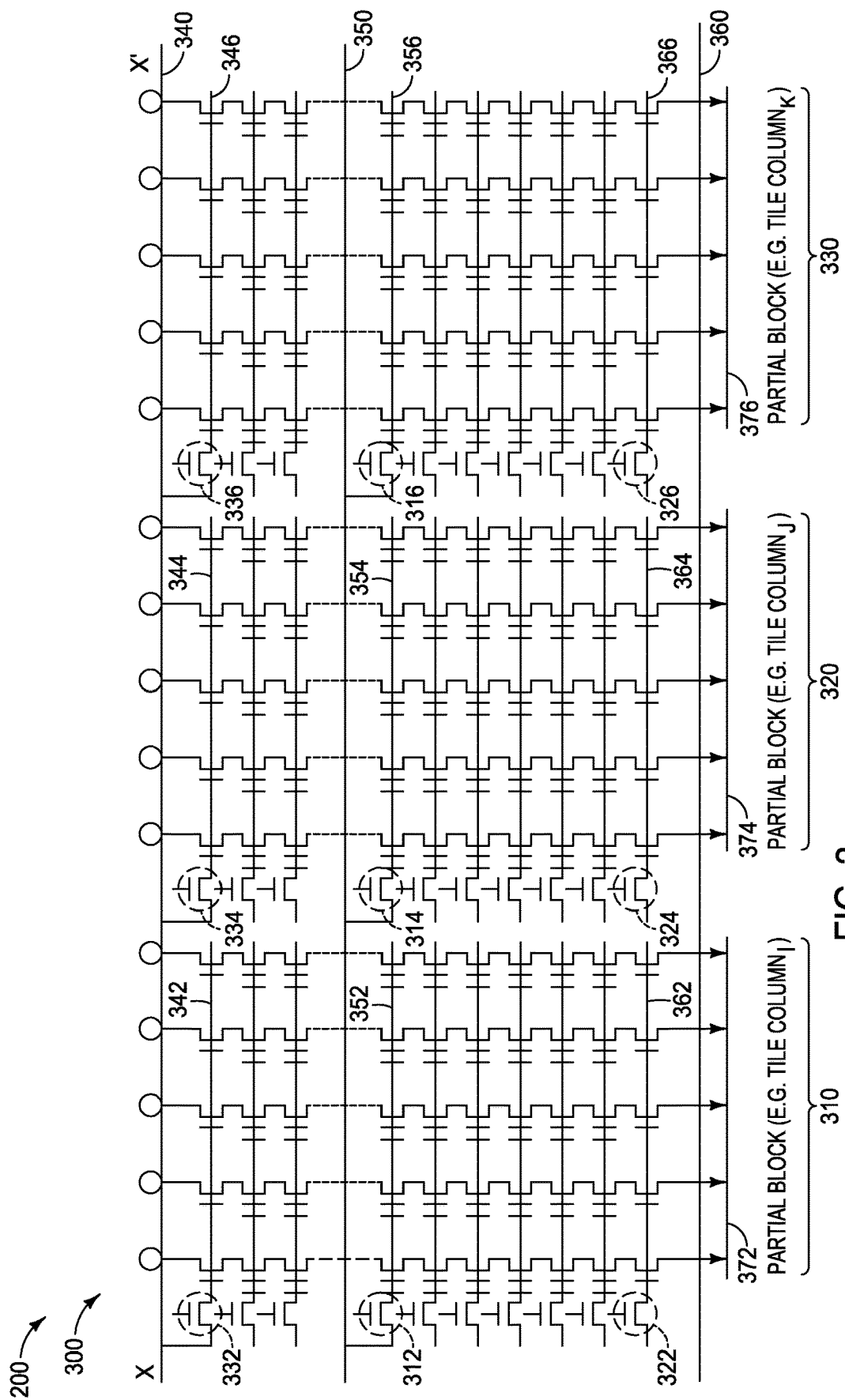
FIG. 3 shows a cross sectional view of the prior art 3D NAND memory device of FIG. 2 in an X-X' direction.
Figure 4:
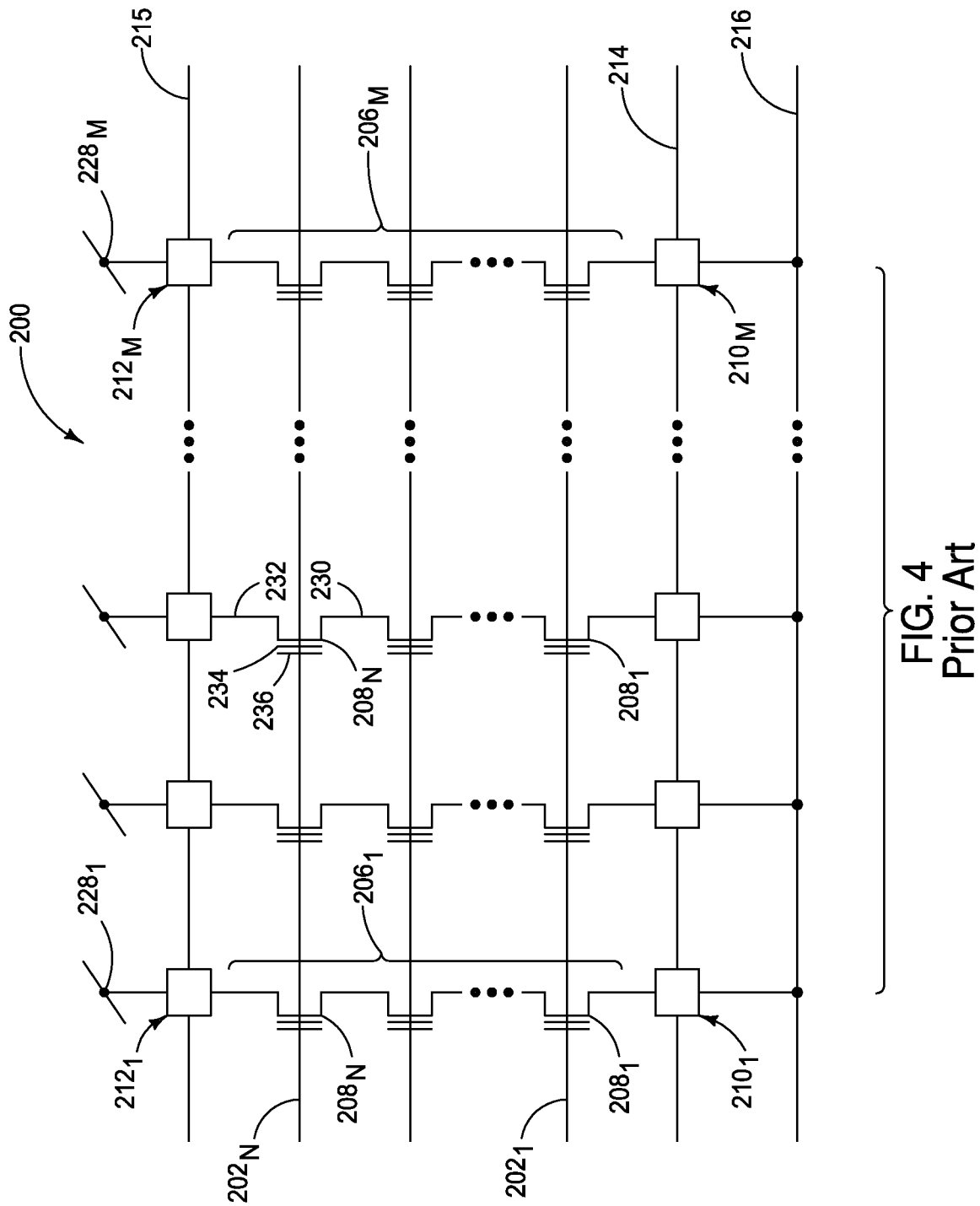
FIG. 4 is a schematic diagram of a prior art NAND memory array.
Figure 5:
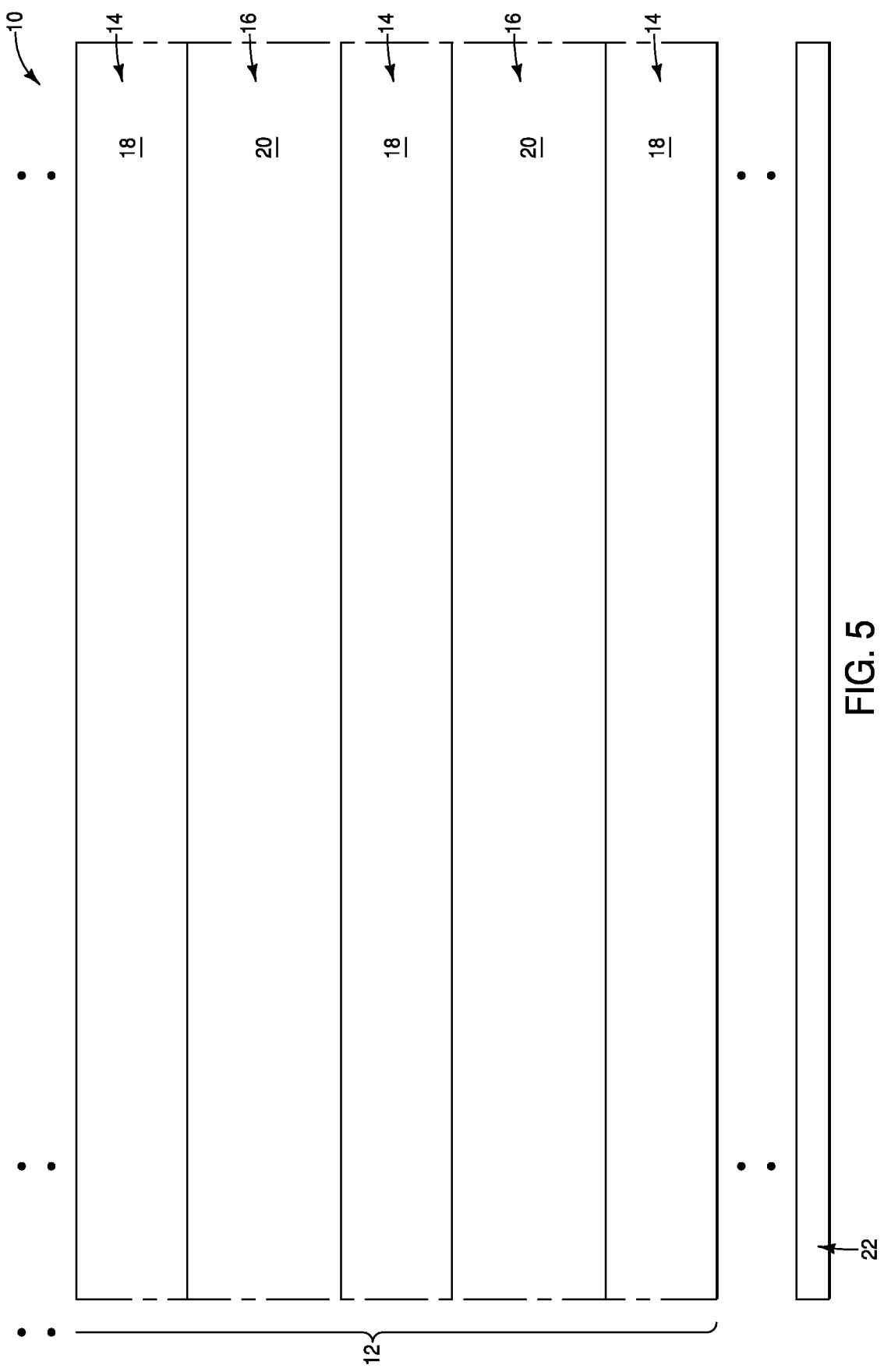
FIGS. 5-10 and 13-17 are diagrammatic cross-sectional side views of a region of an integrated assembly at example process stages of an example method for forming an example structure.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first material 18 may be may be insulative material (e.g., silicon dioxide), and the second material 20 may be sacrificial material (e.g., silicon nitride).

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the second levels 16 may be thicker than the first levels 14. For instance, in some embodiments the second levels 16 may have thicknesses within a range of from about 20 nm to about 40 nm, and the first levels 14 may have thicknesses within a range of from about 15 nm to about 30 nm.

Some of the sacrificial material 20 of the second levels 16 is ultimately replaced with conductive material of memory cell gates. Accordingly, the levels 16 may ultimately correspond to memory cell levels of a NAND configuration. The NAND configuration will include strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend upwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
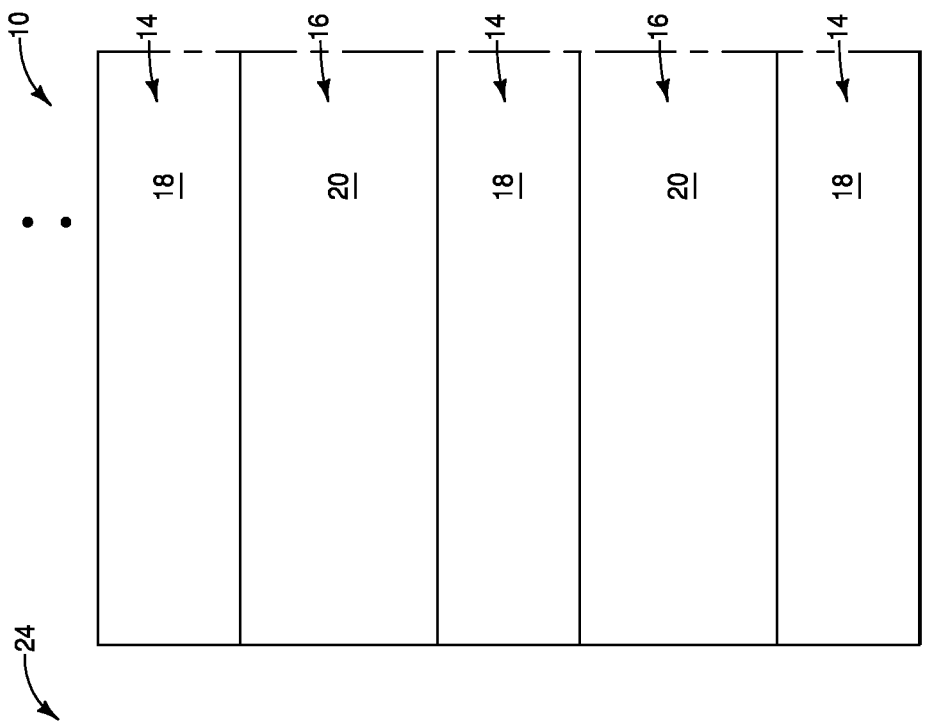
Figure 6:
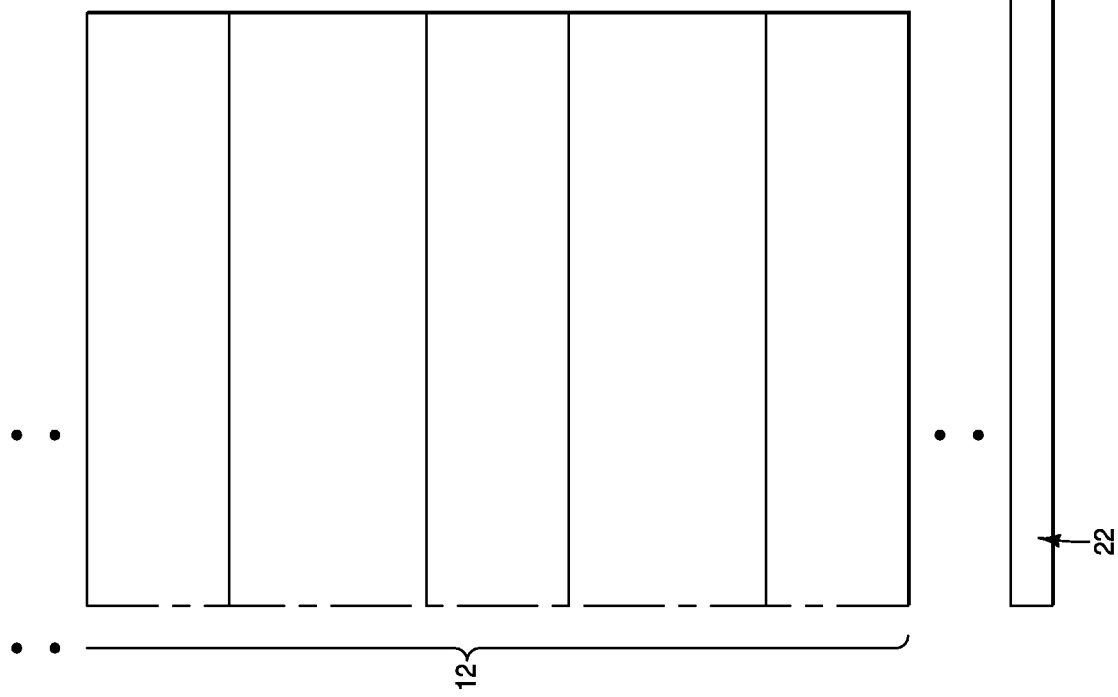

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 14 of the illustrated region of construction 10, and illustrates an example configuration in which the opening 24 is circular-shaped when viewed from above. The opening may be representative of a large number of substantially identical openings formed through the stack 12 during fabrication of a memory array (with the term "substantially identical" meaning identical to within reasonable tolerances of fabrication and measurement).

Figure 7:
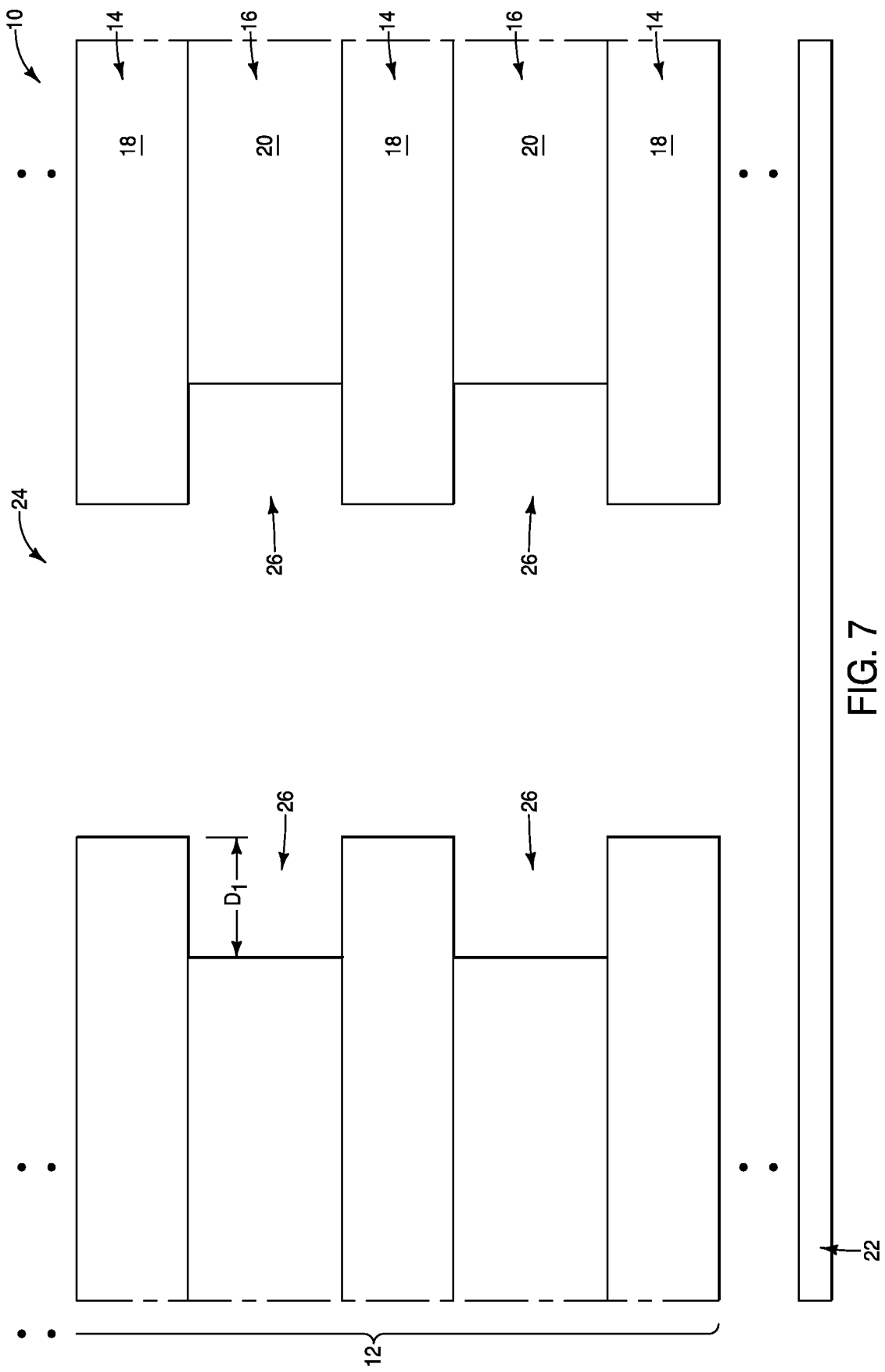

Referring to FIG. 7, the material 20 of the second levels 16 is recessed along the opening 24 to form cavities 26. In some embodiments, the material 20 of the second levels 16 may comprise, consist essentially of, or consist of silicon nitride; and the material 18 of the first levels 14 may comprise, consist essentially of, or consist of silicon dioxide. In such embodiments, the material 20 may be selectively etched relative to the material 18 utilizing phosphoric acid. The term "selective etching" means that a material is removed faster than another material, and includes, but is not limited to, etching processes which are 100% selective for one material relative to another.

Each of the cavities 26 may be formed to a depth $D_1$ within a range of, for example, from about 10 nm to about 30 nm.

Figure 8:
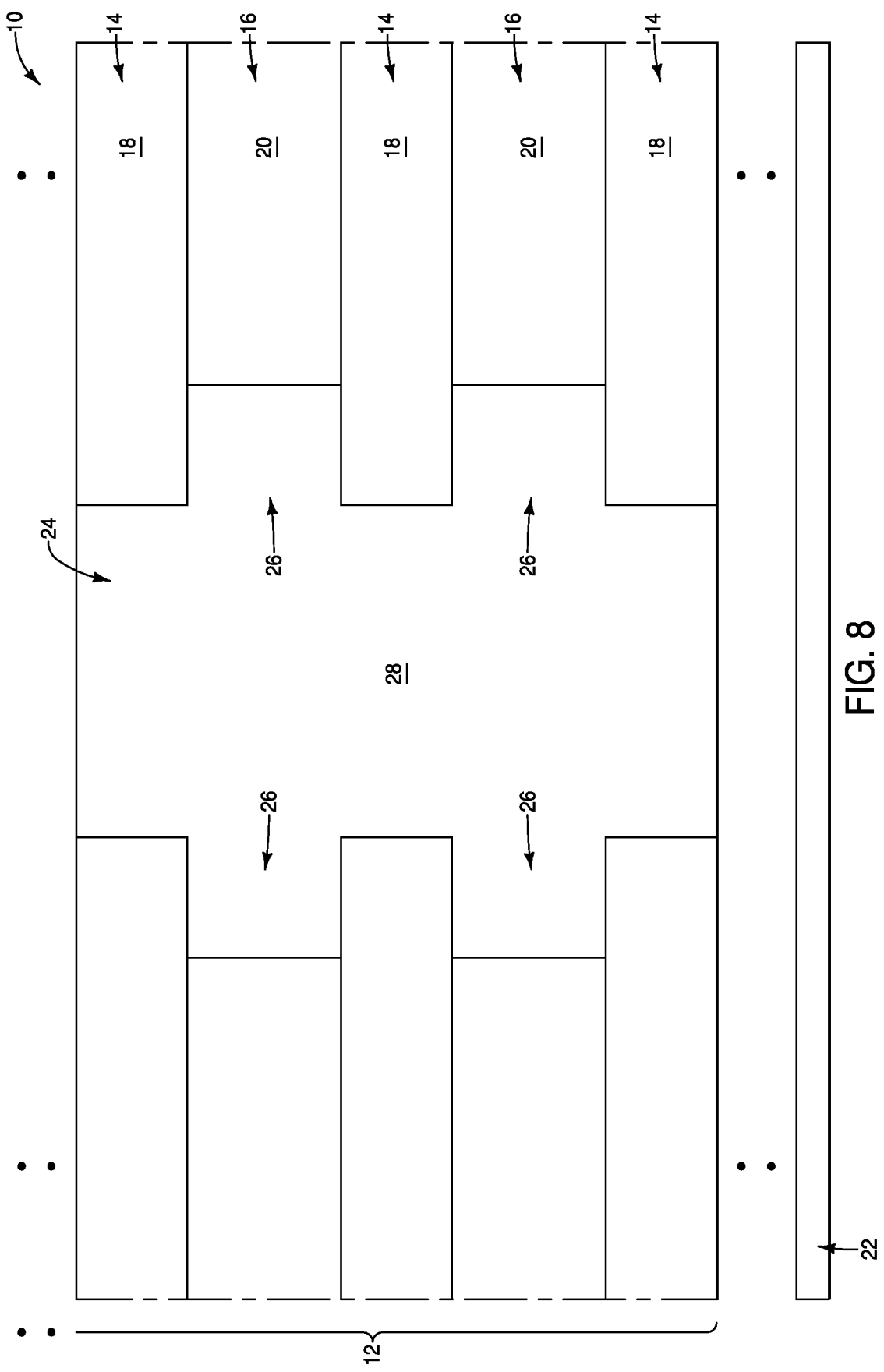

Referring to FIG. 8, semiconductor material 28 is formed within the opening 24. The semiconductor material 28 extends into the cavities 26.

The semiconductor material 28 may comprise any suitable composition(s); and in some embodiments may comprise, consist essentially of, or consist of silicon (e.g., polycrystalline silicon).

Figure 9:
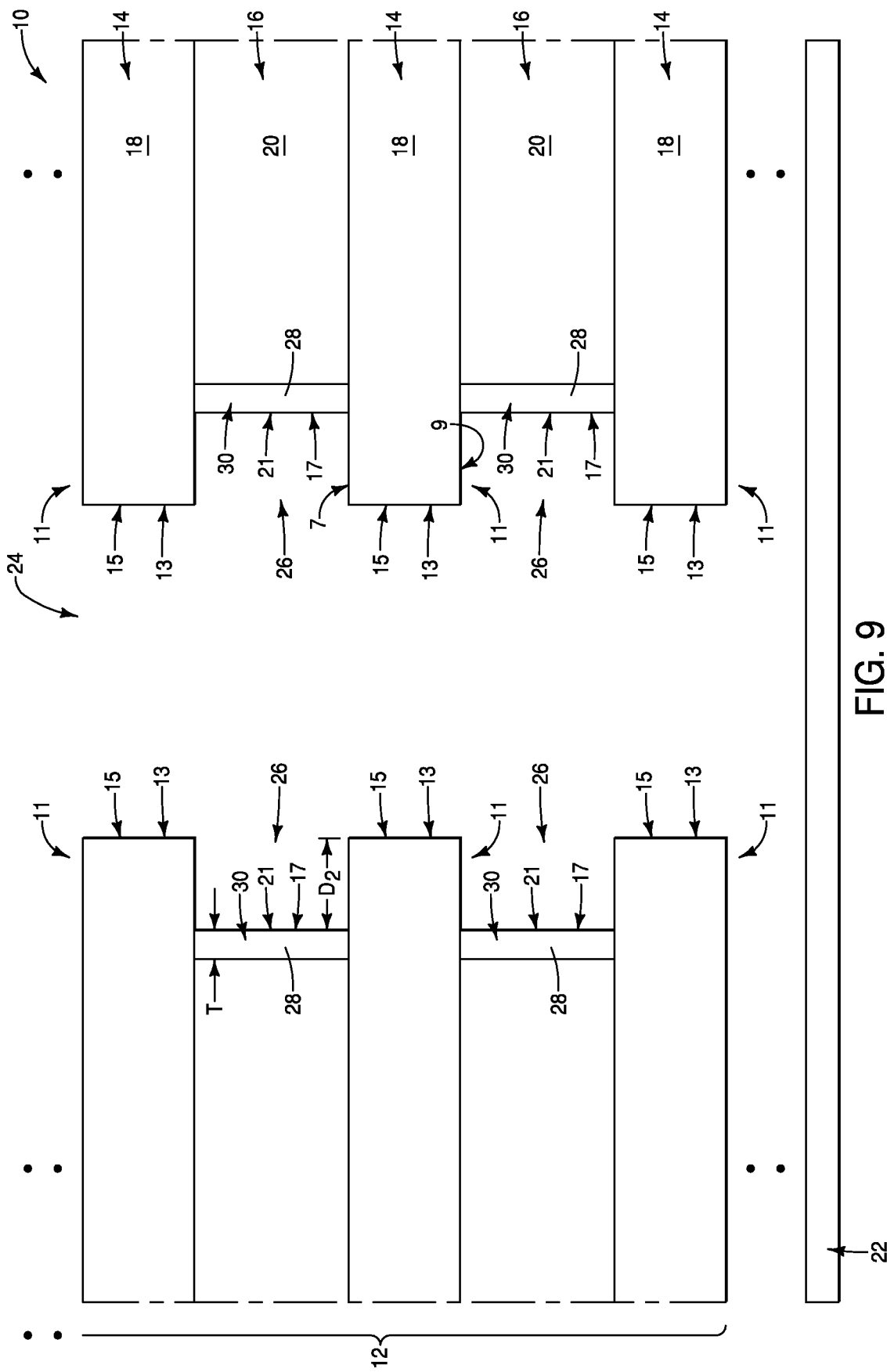

Referring to FIG. 9, semiconductor material 28 is removed from within the opening 24, while leaving liners 30 of the material 28 within the cavities 26. The liners 30 are along the second levels 16. In some embodiments, the materials 20 and 28 comprise silicon nitride and silicon, respectively. In such embodiments, the second levels 16 may be considered to comprise silicon nitride 20 capped with silicon 28. The liners 30 may have any suitable lateral thickness, T; and in some embodiments such lateral thickness may be within a range of from about 1 nm to about 25 nm.

Each of the cavities 26 may have a remaining depth $D_2$ within a range of, for example, from about 1 nm to about 29 nm at the process stage of FIG. 9.

The first levels 14 have projections 11 extending laterally outwardly beyond the second levels 16. Such projections include upper surfaces 7, lower surfaces 9, and vertical faces (or edges) 13 between the upper and lower surfaces.

The first and second levels 14 and 16 have exposed surfaces 15 and 17, respectively, along the opening 24. The surfaces 15 and 17 may be referred to as first and second surfaces, respectively. The surfaces 17 are along exposed vertical faces (or edges) 21 of the second levels 16; and the surfaces 15 are along the exposed vertical faces (or edges) 13 of the first levels 14, as well as along the upper and lower surfaces 7 and 9 of the projections 11. The vertical faces 13 and 21 may be referred to as first and second vertical faces, respectively. However, the terms "first" and "second" are arbitrary, and the vertical faces 13 and 21 may be alternatively referred to as second and first vertical faces, respectively.

The exposed surfaces 15 of the first levels 14 may, for example, comprise, consist essentially of, or consist of silicon dioxide. The exposed surfaces 17 of the second levels 16 may, for example, comprise, consist essentially of, or consist of silicon. In some embodiments, the exposed surfaces 15 may be considered to comprise OH-moieties, and the exposed surfaces 17 may be considered to be substantially lacking OH-moieties (with the term "substantially lacking" meaning to have no OH-moieties to within reasonable tolerances of fabrication and measurement). If the surfaces 17 are along silicon, it may be desirable to treat such surfaces with HF or other suitable substance to remove any native oxide which may have formed along such surfaces.

Figure 10:
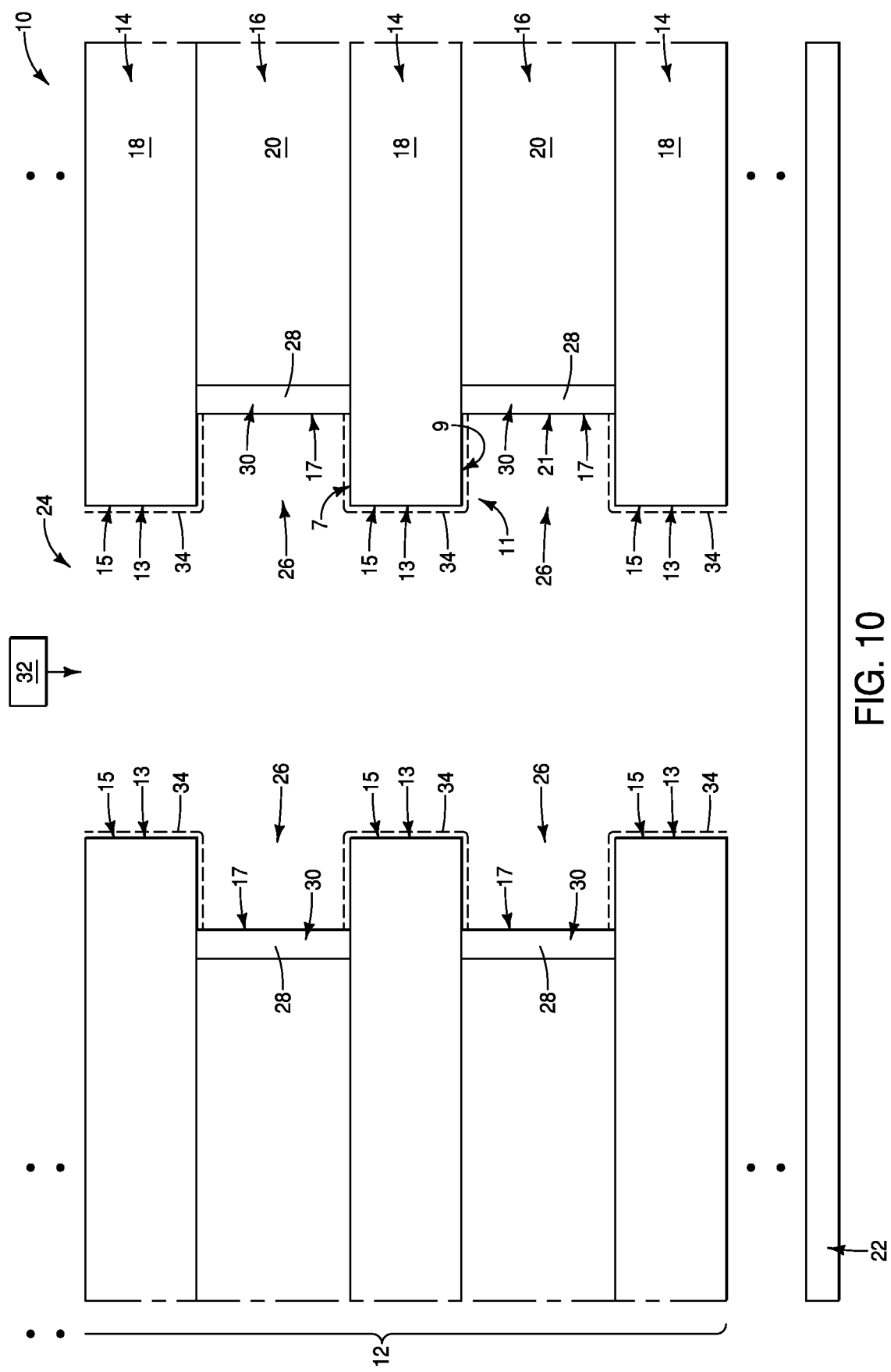

Referring to FIG. 10, precursor 32 is flowed into the opening 24. The precursor reacts with the OH-moieties along the exposed surfaces 15 to coat the surfaces 15 with hindering material 34. Dashed lines are provided to diagrammatically indicate that the hindering material 34 is provided over the exposed surfaces 15. The hindering material may comprise any suitable composition (e.g., may be organic, and may further comprise one or both of nitrogen and silicon), with example compositions being understood by persons of ordinary skill after reviewing the list of example precursors 32 described below with reference to FIG. 12. The hindering material 34 hinders formation of trapping material (e.g., silicon nitride, silicon oxynitride, etc.) along the surfaces 15 as described in more detail below with reference to FIG. 13.

Figure 11:
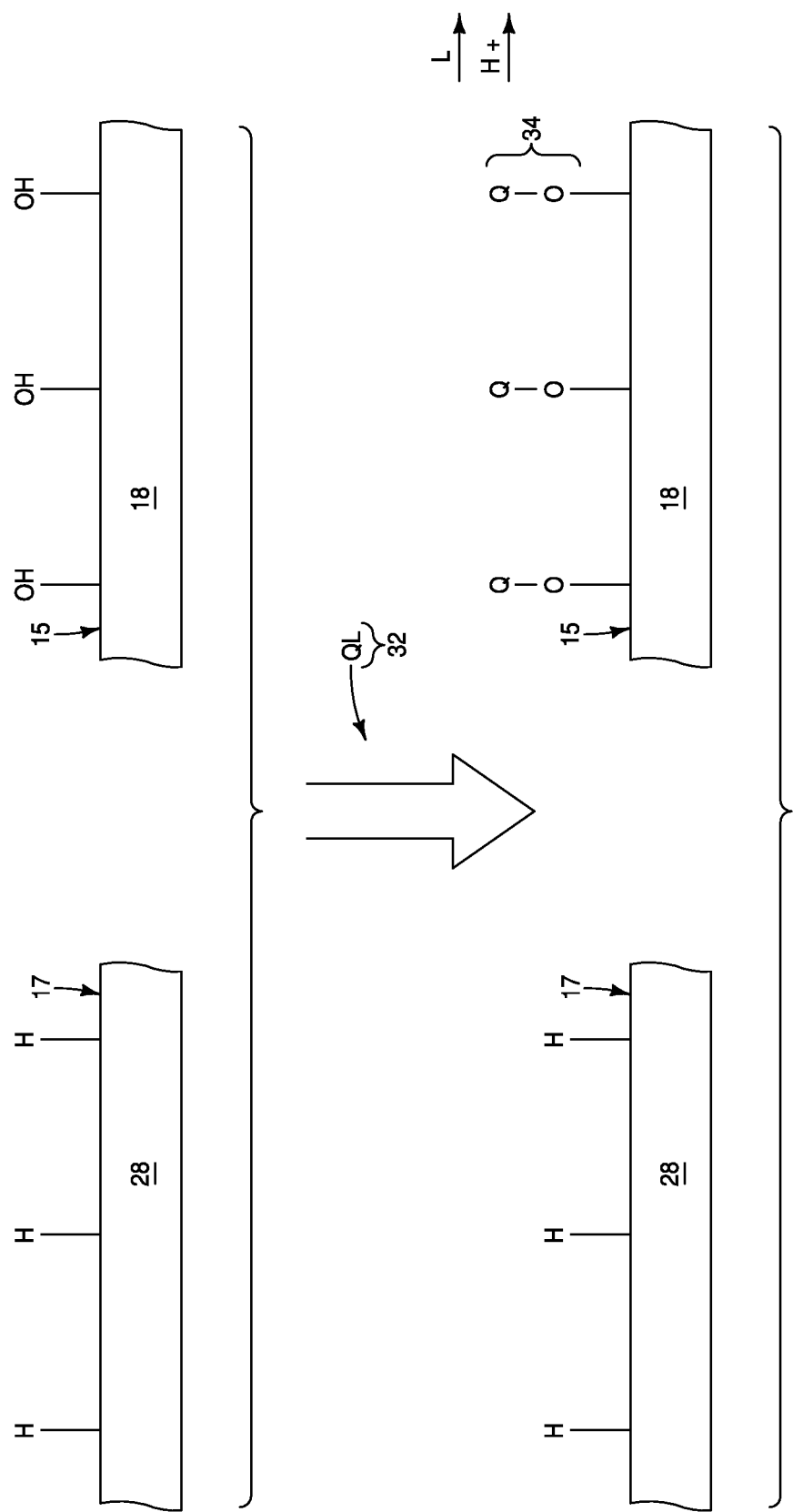
FIG. 11 shows diagrammatic cross-sectional side views of example process stages for selectively coating a surface of one material relative to a surface of another material.

The hindering material 34 may be formed with any suitable processing. FIG. 11 diagrammatically illustrates example chemistry which may enable the precursor 32 to be formed to selectively coat the surfaces 15 relative to the surfaces 17. The precursor 32 is illustrated to comprise QL, where L is a leaving group. The surface 15 comprises the OH-moieties. The precursor reacts with OH-moieties such that Q bonds to oxygen of the OH-moieties. The leaving group L is displaced from QL upon the bonding of Q to the oxygen, and protons (H$^+$) may be displaced from the OH-moieties upon such bonding. The coating 34 comprises the Q bonded to the oxygen from the OH-moieties.

Figure 12:
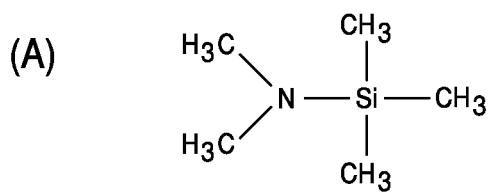
FIG. 12 diagrammatically illustrates example precursors which may be utilized in some example embodiments.
Figure 12:
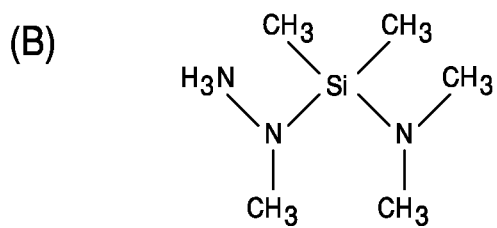
Figure 12:
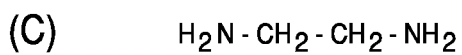
Figure 12:
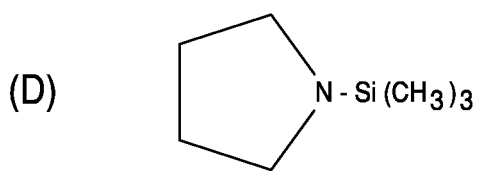
Figure 12:
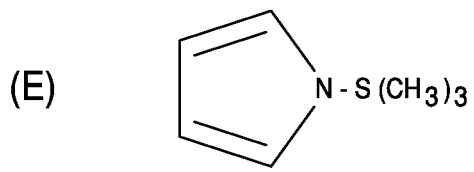
Figure 12:
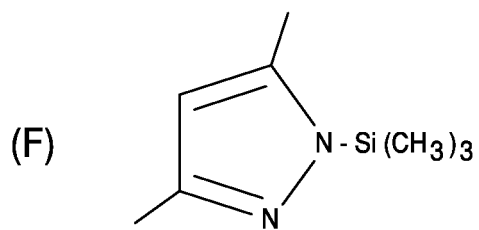
Figure 12:
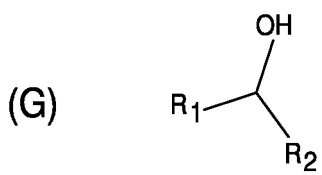

Examples substances which may be utilized for the precursor 32 are shown in FIG. 12 as substances A-G. The precursor may include one or more of such substances; with the example substances including N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and $R_1$—(C—OH)—$R_2$; where $R_1$ and $R_2$ are organic moieties.

Figure 13:
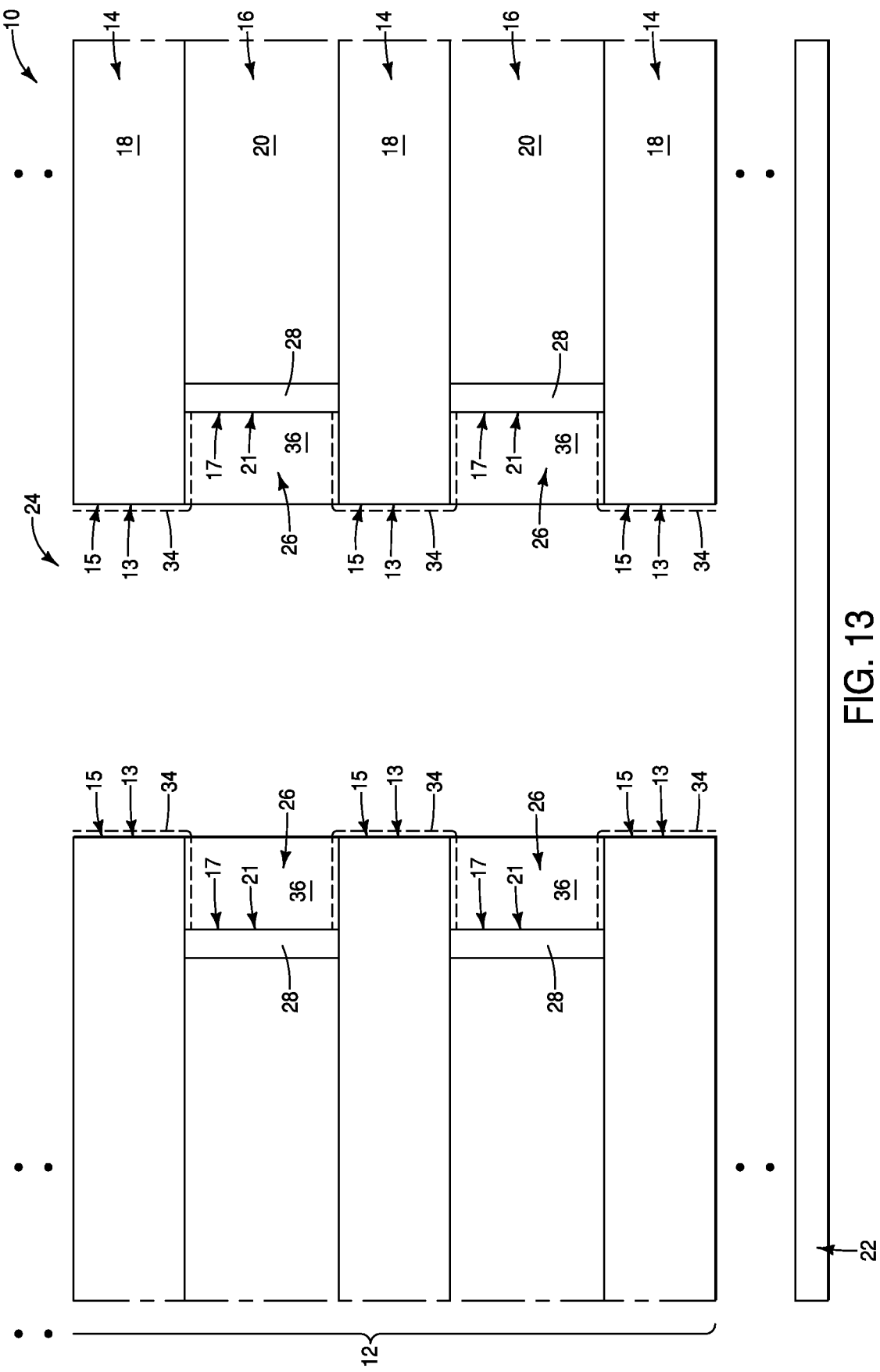

Referring to FIG. 13, charge-trapping material 36 is selectively deposited along the surfaces 17 relative to the coated surfaces 15. The charge-trapping material may be formed utilizing ALD under conditions in which the hindering material 34 substantially precludes growth of the material 36 from the surfaces 15. Such preclusion of growth may be due to steric effects and/or to any other suitable interactions. It is noted that the material 36 growing along surfaces 17 may cover some of the coated surface 15, as shown within the cavities 26.

The charge-trapping material 36 may comprise any suitable composition or combination of compositions; and in some embodiments, may comprise, consist essentially or, or consist of one or both of silicon nitride and silicon oxynitride. The term "charge trap" may refer to an energy well that can reversibly capture a charge carrier (e.g., an electron or hole).

Figure 14:
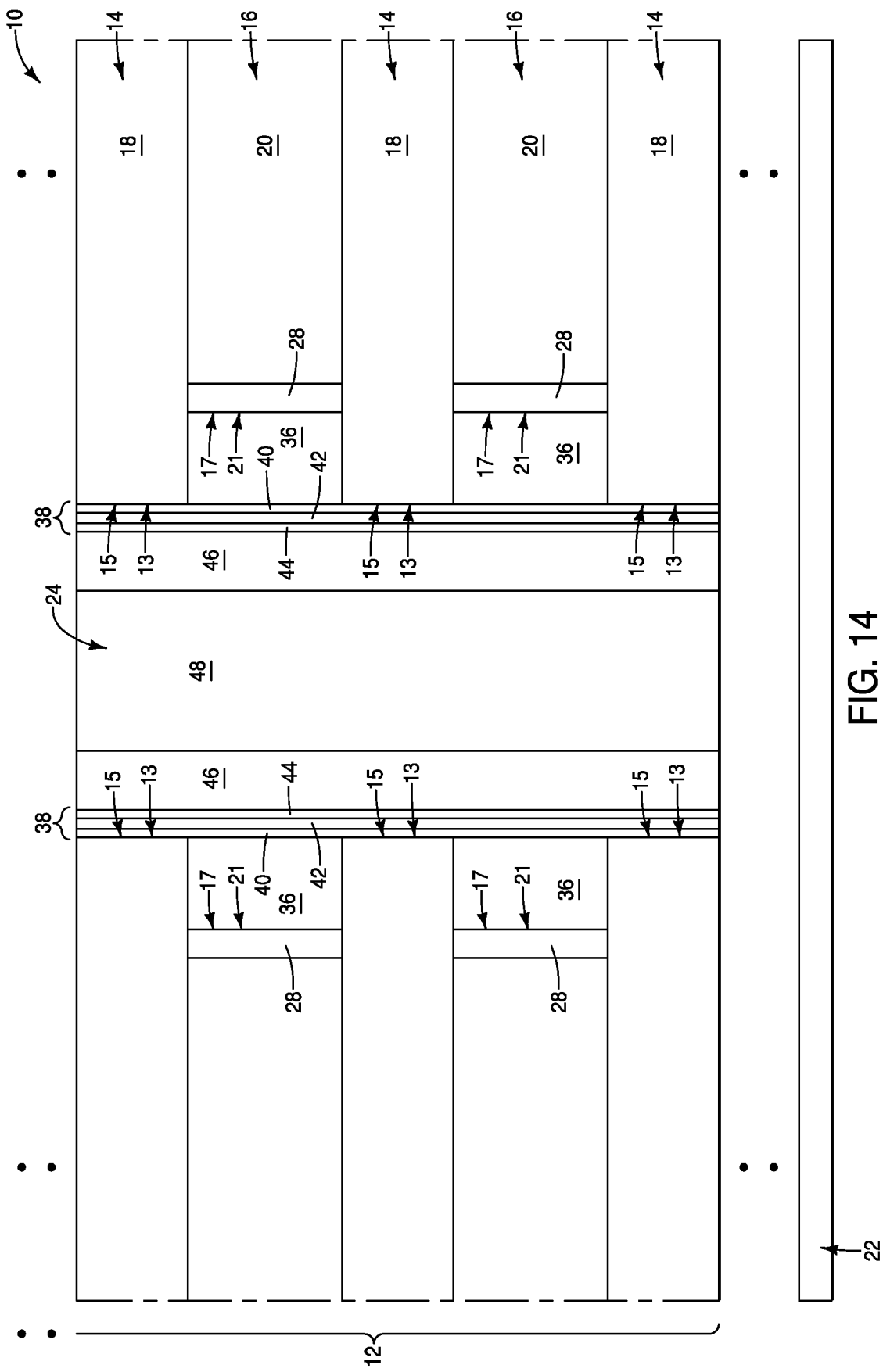

Referring to FIG. 14, tunneling material 38 is formed to extend vertically along the first and second levels 14 and 16. The tunneling material can function as a material through which charge carriers tunnel or otherwise pass during programming operations, erasing operations, etc. In the illustrated embodiment, the tunneling material includes three compositions 40, 42 and 44. In other embodiments, there may be fewer than three tunneling compositions; and in yet other embodiments there may be more than three tunneling compositions. In the shown embodiment, the compositions 40 and 44 may be referred to as outer compositions, and the composition 42 may be referred to as a middle composition which is between the outer compositions 40 and 44. In some embodiments, the tunneling compositions 40, 42 and 44 may be band-gap engineered to have desired charge tunneling properties. The middle composition 42 is generally compositionally different from the outer compositions 40 and 44. The compositions 40 and 44 may or may not be compositionally different from one another. In some example embodiments, the middle tunneling composition 42 may comprise one or both of silicon nitride and silicon oxynitride; and the outer tunneling compositions 40 and 44 may comprise silicon dioxide.

In some contexts, the tunneling material may be referred to as gate dielectric material, or simply as dielectric material.

The compositions 40, 42 and 44 may be formed to any suitable thicknesses. In some embodiments, the compositions may be formed to thicknesses within a range of from about 10 angstroms (Å) to about 30 Å; and accordingly the tunneling material 38 may have an overall thickness within a range of from about 30 Å to about 90 Å.

The coating 34 (FIG. 13) is shown to be removed at the processing stage of FIG. 14. Such may result from oxidation of the coating during formation of the tunneling material 38. In other embodiments, some of the coating 34 may remain at the processing stage of FIG. 14. The tunneling material 38 is directly against the vertical faces 13 of the first levels 14 in the shown embodiment, and is spaced from the vertical faces 21 of the second levels 16 by the charge-trapping material 36.

Channel material 46 is formed within the opening 24 and along the tunneling material 38. In the illustrated embodiment, the channel material 46 is directly against the tunneling material 38, and extends vertically along the first and second levels 14 and 16.

The channel material 46 may comprise any suitable appropriately-doped semiconductor material(s). In some embodiments, the channel material 46 may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 46 may comprise, consist essentially of, or consist of silicon.

In the illustrated embodiment, the channel material 46 lines a periphery of the opening 24, and insulative material 48 fills a remaining interior region of the opening 24. The insulative material 48 may comprise any suitable composition or combination of compositions, such as, for example, silicon dioxide. The illustrated configuration of the channel material 46 may be considered to be a hollow channel configuration, in that the insulative material 48 is provided within a "hollow" in the channel configuration. In other embodiments, the channel material may be configured as a solid pillar.

Figure 15:
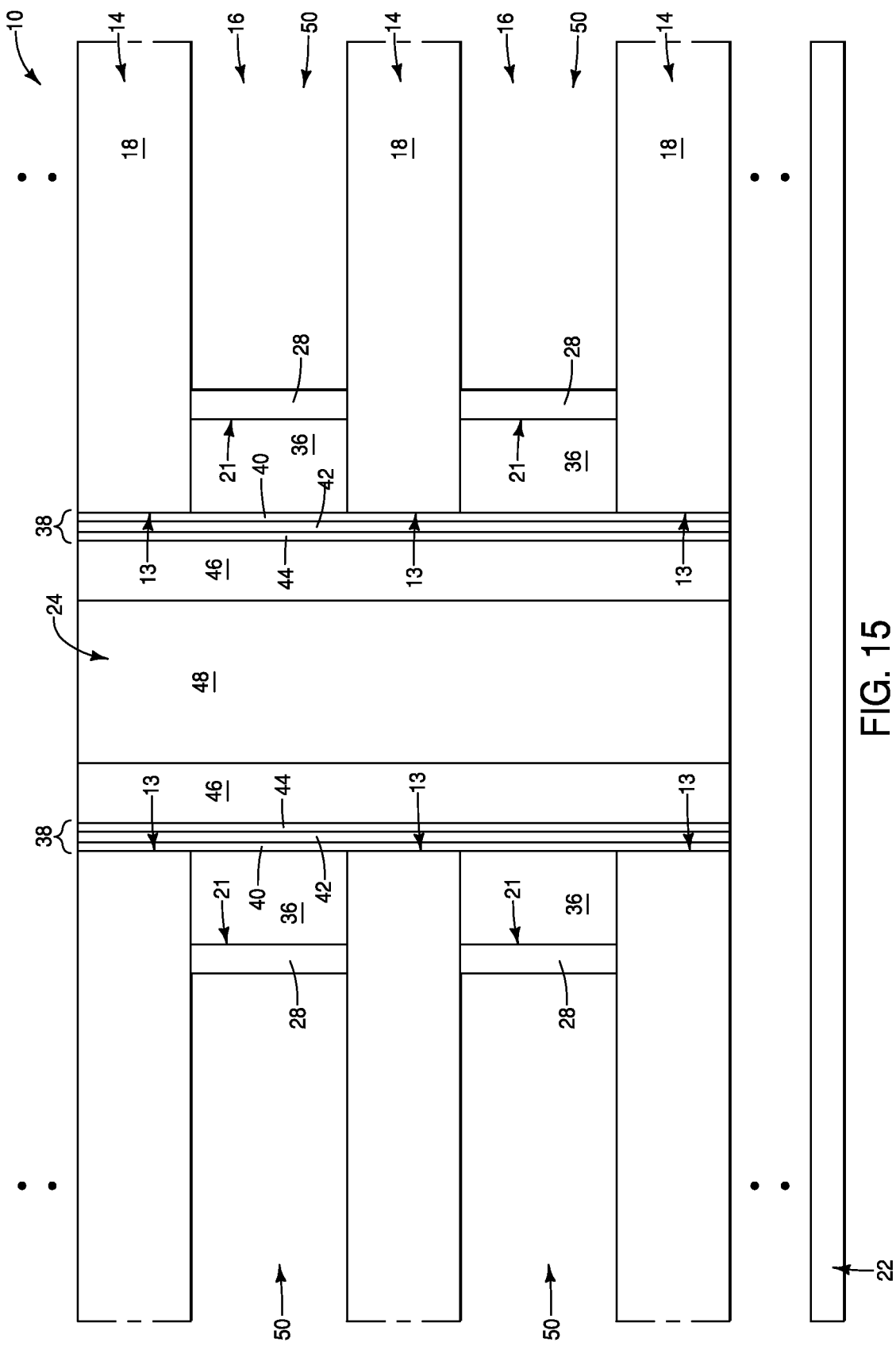

Referring to FIG. 15, the second material 20 (FIG. 14) is removed to leave voids 50. Such removal may be accomplished with any suitable etch which is selective for the second material 20 relative to the materials 18 and 28. In a processing step which is not shown, slits may be formed through stack 12 (FIG. 14) to provide access to the first and second levels 14/16. Etchant may be flowed into such slits to remove the second material 20.

Figure 16:
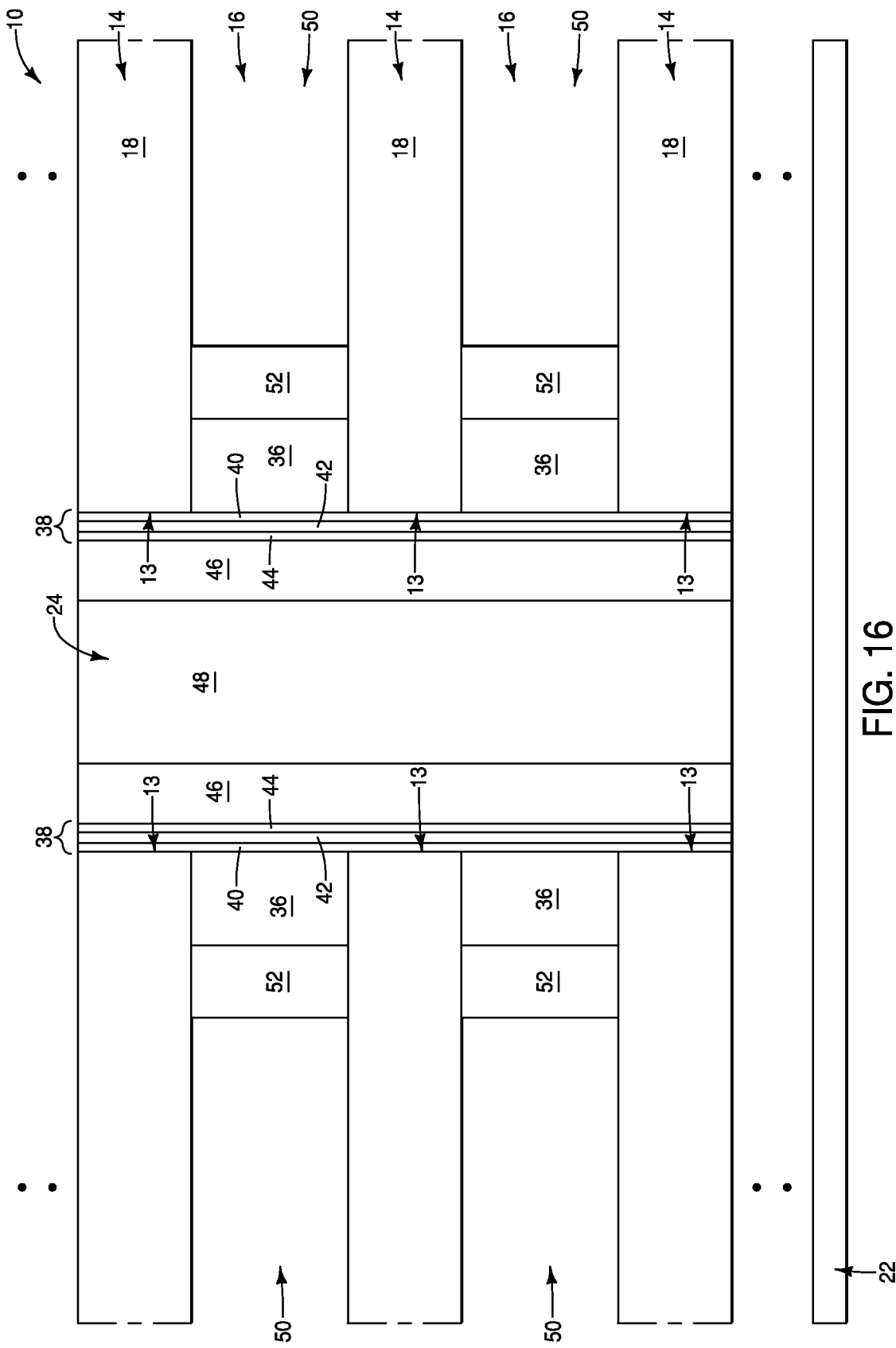

Referring to FIG. 16, the semiconductor material 28 (FIG. 15) is oxidized to form a charge-blocking dielectric material 52. In some embodiments, the semiconductor material 28 may comprise, consist essentially of, or consist of silicon; and the charge-blocking material 52 may comprise, consist essentially of, or consist of silicon dioxide.

Figure 17:
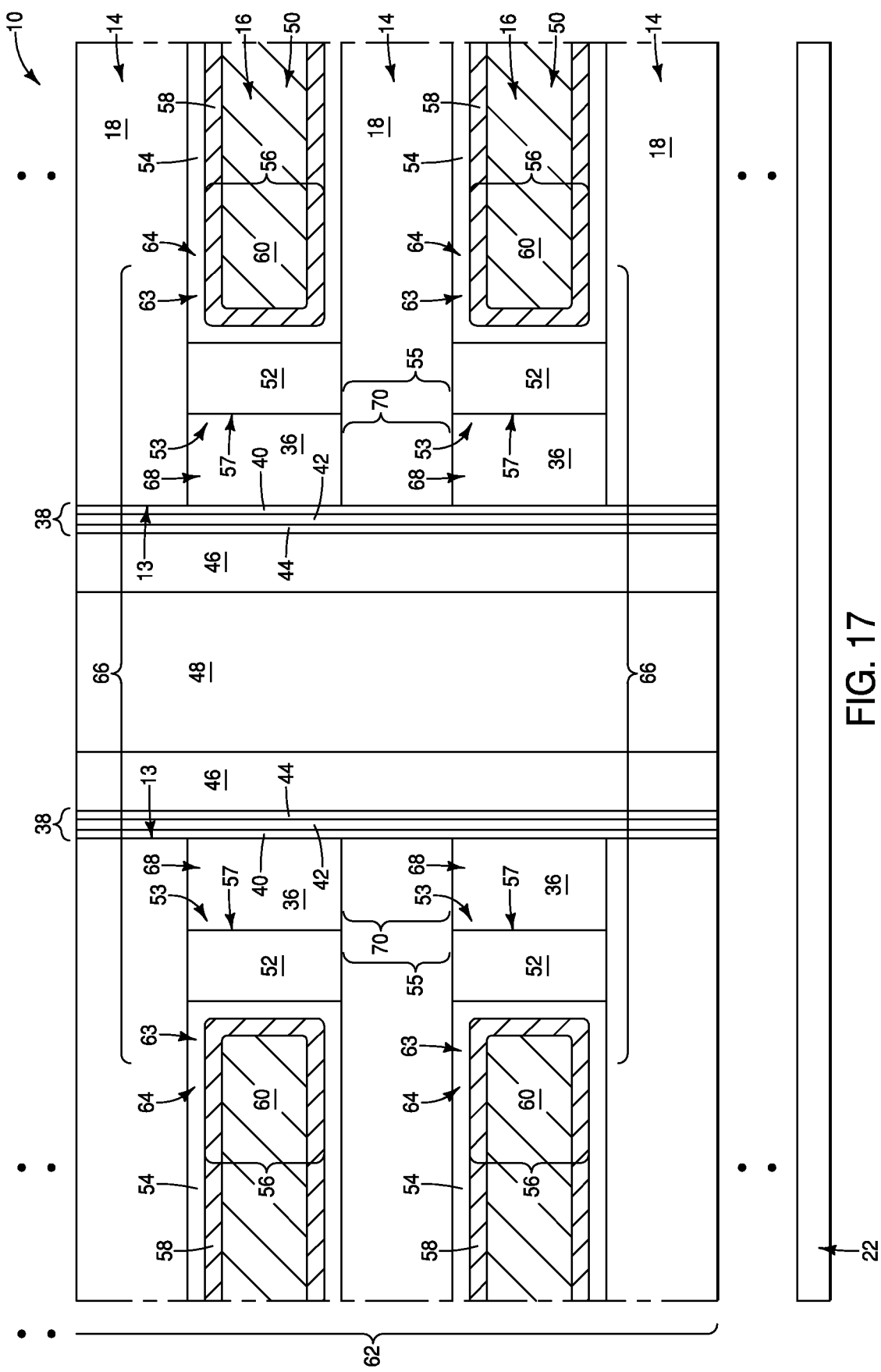

Referring to FIG. 17, additional charge-blocking material 54 is formed within voids 50 to line the voids. The charge-blocking material 54 may comprise high-k material; and in some embodiments may comprise, consist essentially of, or consist of one or more of aluminum oxide, hafnium oxide, zirconium oxide and tantalum oxide.

Conductive material 56 is formed within the lined voids 50. The conductive material 56 may be referred to as conductive wordline material. In the shown embodiment, the conductive material 56 includes an outer layer 58 along the charge-blocking material 54, and an inner core region 60. The outer layer 58 may comprise metal nitride (e.g., titanium nitride, tungsten nitride, etc.), and may be referred to as a metal-nitride outer region. The core region 60 may comprise metal (e.g., tungsten, titanium, etc.), and may be referred to as a metal-containing core inner region.

The construction 10 of FIG. 17 may be considered to comprise a vertical stack 62 of alternating conductive wordline levels 16 and insulative levels 14. The conductive wordline levels have terminal ends 63, and the charge blocking material 52 is adjacent such terminal ends. The wordline levels comprise gates 64 along the terminal ends 63. The gates are incorporated into memory cells (e.g., NAND memory cells) 66.

The charge-blocking materials 52 and 54 may be together utilized to block charge from flowing from the charge-storage material 36 to a gate 64 during operation of a memory cell 66, as well as to inhibit back-tunneling of electrons from the gate toward the charge-storage material.

In some embodiments, the charge-blocking material 52 may be considered to be arranged as vertically stacked segments 53 which are spaced from one another by intervening regions (i.e., gaps) 55. The segments 53 may be considered to have first vertical faces 57 which are laterally outward of the conductive terminal ends 63.

The insulative levels 14 have terminal ends with the vertical faces 13. The vertical faces 13 may be referred to as second vertical faces to distinguish them from the first vertical faces 57. The terms "first" and "second" are arbitrary, and in some embodiments the vertical faces 57 and 13 may be referred to as second and first vertical faces, respectively. In the shown embodiment, the insulative levels extend into the gaps 55, and extend entirely through the gaps 55. Generally, the illustrated embodiment shows an application in which the insulative levels 14 may be considered to extend at least partially into the intervening gaps 55.

The vertical faces 13 are laterally offset from the vertical faces 57, and in the shown embodiment may be considered to be laterally outward of the vertical faces 57.

The charge-trapping material 36 is along the vertical faces 57, and is not along the vertical faces 13 in the embodiment of FIG. 17. In other embodiments (discussed below with reference to FIGS. 26 and 28), the charge-trapping material 36 may extend at least partially along the vertical faces 13.

The charge-trapping material 36 is configured as segments 68 which are vertically spaced from one another by intervening regions (i.e., gaps) 70. In some embodiments, the intervening gaps 55 and 70 may be referred to as first and second intervening gaps, respectively, to distinguish them from one another.

Another example embodiment method is described with reference to FIGS. 18-26.

Figure 18:
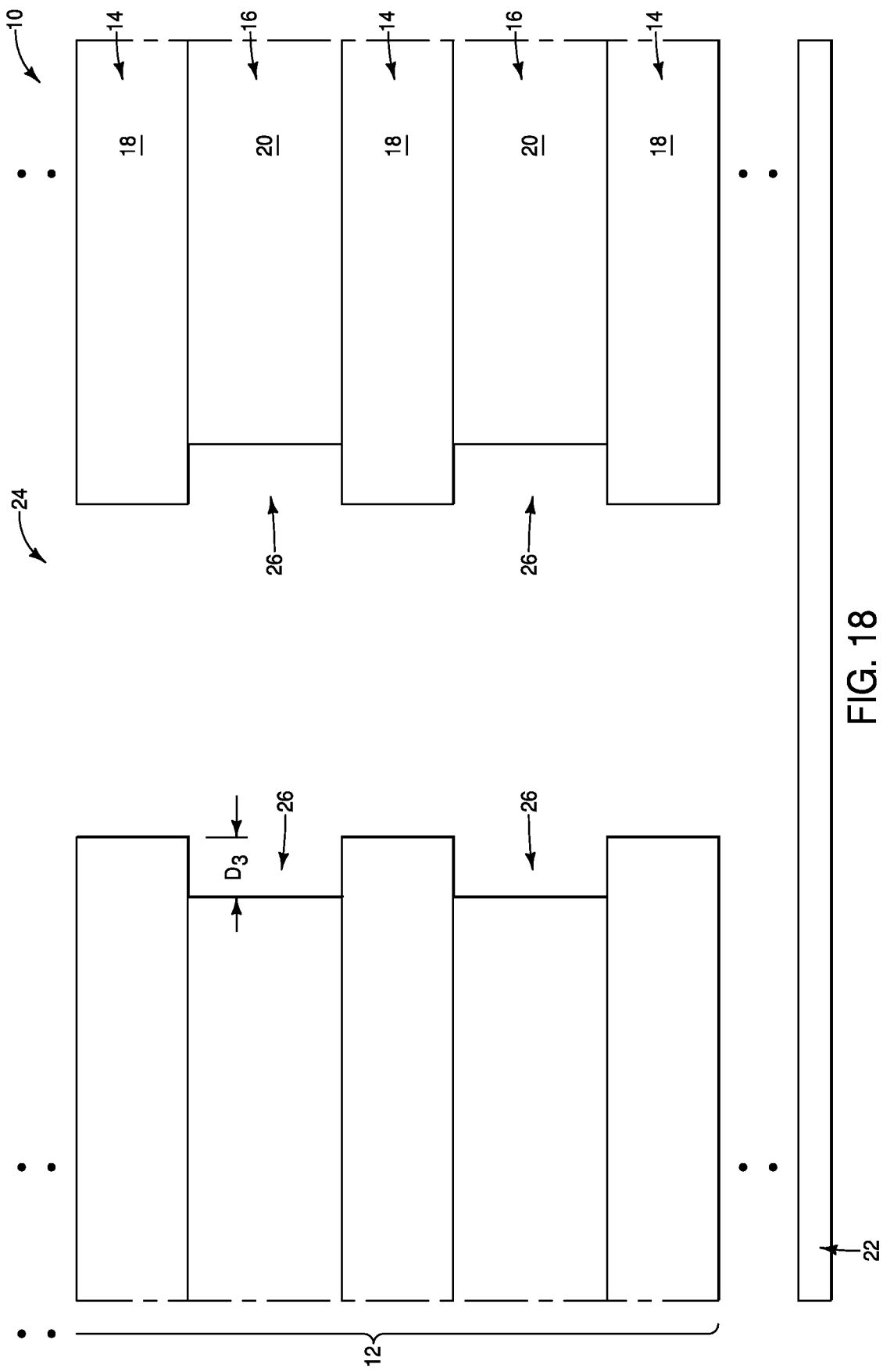
FIGS. 18-26 are diagrammatic cross-sectional side views of a region of an integrated assembly at example process stages of an example method for forming an example structure. The process stage of FIG. 18 may follow that of FIG. 6.

Referring to FIG. 18, the construction 10 is shown at a processing stage which may follow that of FIG. 6, and which may be alternative to the processing stage described above with reference to FIG. 7. The construction 10 of FIG. 18 has the material 20 of the second levels 16 recessed along the opening 24 to form cavities 26. The cavities 26 may be formed to a depth $D_3$ which is relatively shallow as compared to the depth $D_1$ described above with reference to FIG. 7. In some embodiments, the depth $D_3$ may be within a range of, for example, from about 0 nm to about 10 nm.

Figure 19:
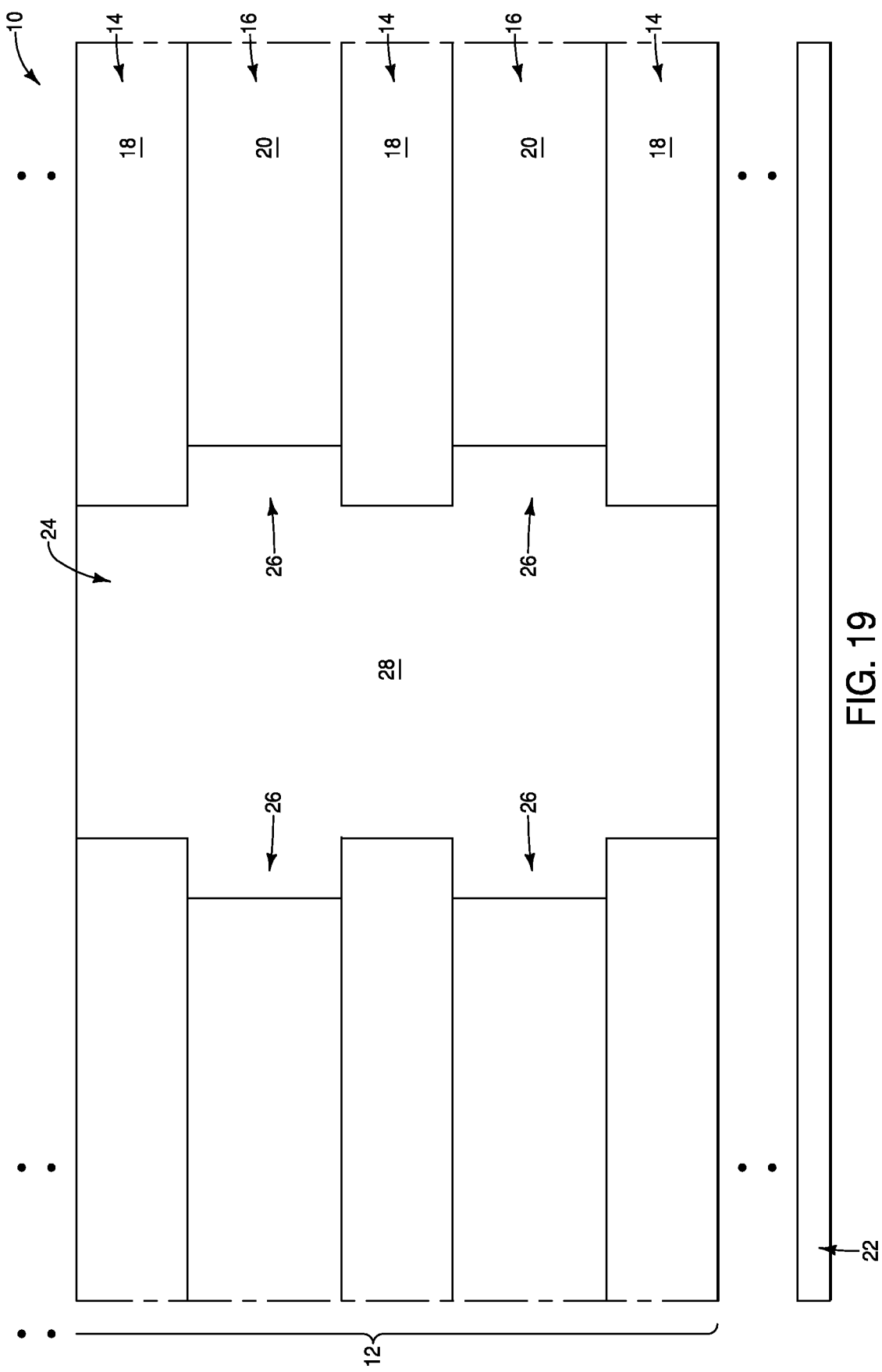

Referring to FIG. 19, the semiconductor material 28 is formed within the opening 24.

Figure 20:
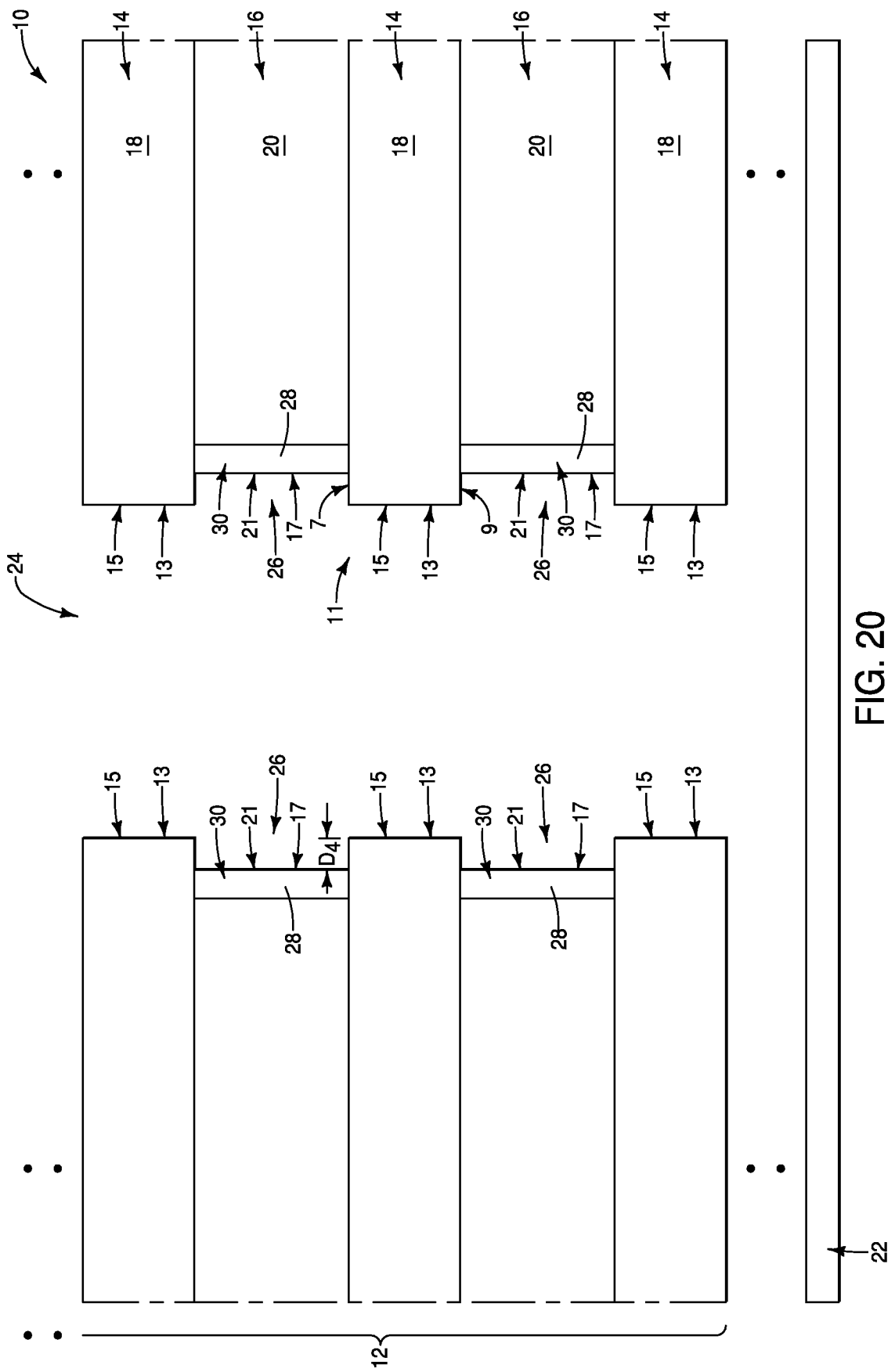

Referring to FIG. 20, the semiconductor material 28 is removed from within the opening 24, while leaving the liners 30 of the material 28 within the cavities 26. In some embodiments, the materials 20 and 28 comprise silicon nitride and silicon, respectively. In such embodiments, the second levels 16 may be considered to comprise silicon nitride 20 capped with silicon 28.

Each of the cavities 26 may have a remaining depth $D_4$ within a range of, for example, from about 0 nm to about 10 nm at the process stage of FIG. 20.

The first levels 14 have the projections 11 extending beyond the second levels 16. Such projections include the upper surfaces 7, the lower surfaces 9, and the vertical faces (or edges) 13 between the upper and lower surfaces. The projections 11 may be considered to extend laterally outwardly of the second levels 16 in some embodiments.

The first and second levels 14 and 26 have the exposed surfaces 15 and 17, respectively, along the opening 24. The surfaces 17 are along the exposed vertical faces (or edges) 21 of the second levels 16; and the surfaces 15 are along the exposed vertical faces (or edges) 13 of the first levels 14, as well as along the upper and lower surfaces 7 and 9 of the projections 11.

The exposed surfaces 15 may comprise the OH-moieties described above with reference to FIG. 9, and the exposed surfaces 17 may be considered to be substantially lacking OH-moieties.

Figure 21:
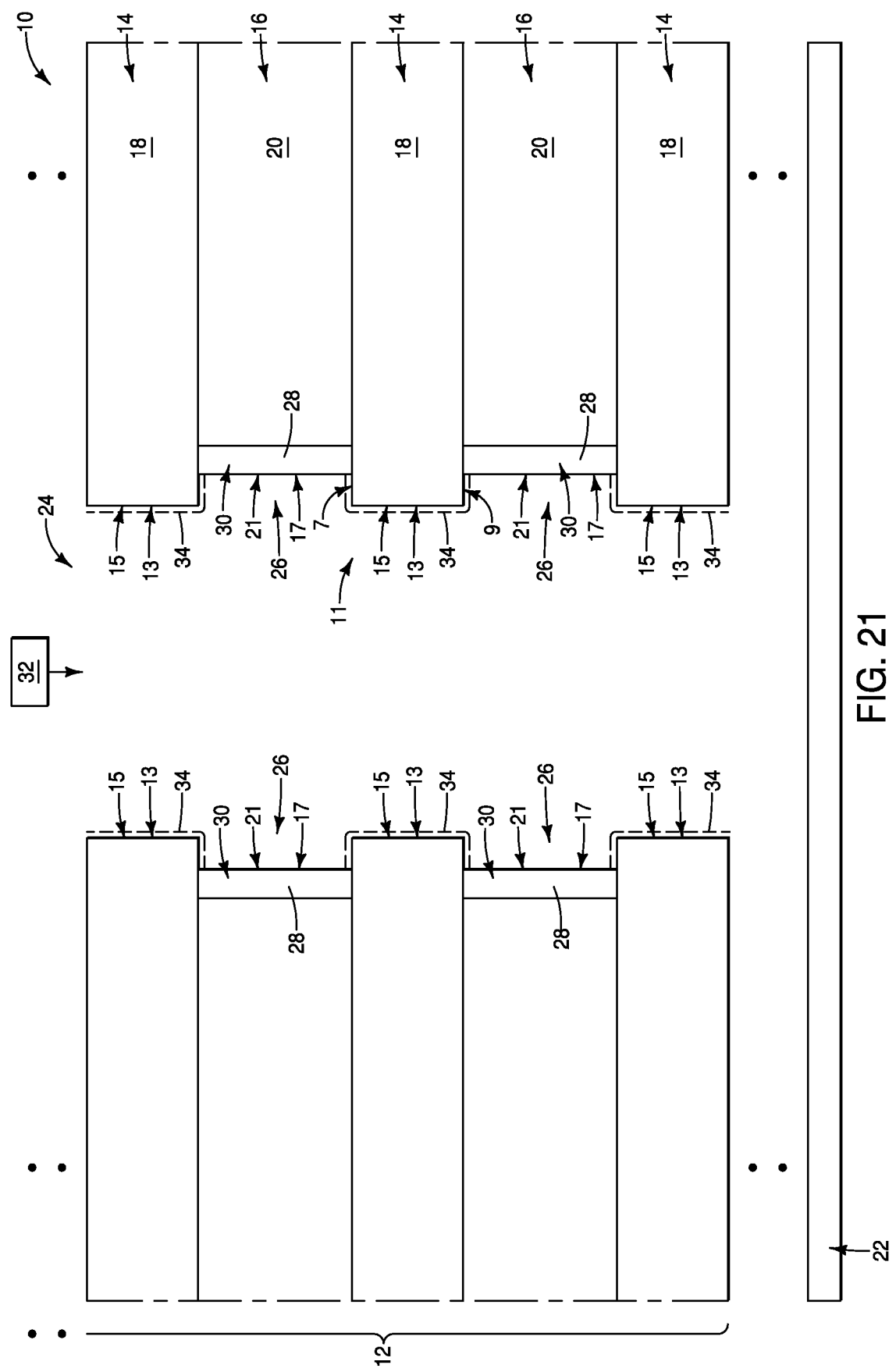

Referring to FIG. 21, precursor 32 is flowed into the opening 24. The precursor reacts with the OH-moieties along the exposed surfaces 15 to coat the surfaces 15 with the hindering material 34. The precursor 32 may comprise any of the substances described above with reference to FIG. 12.

Figure 22:
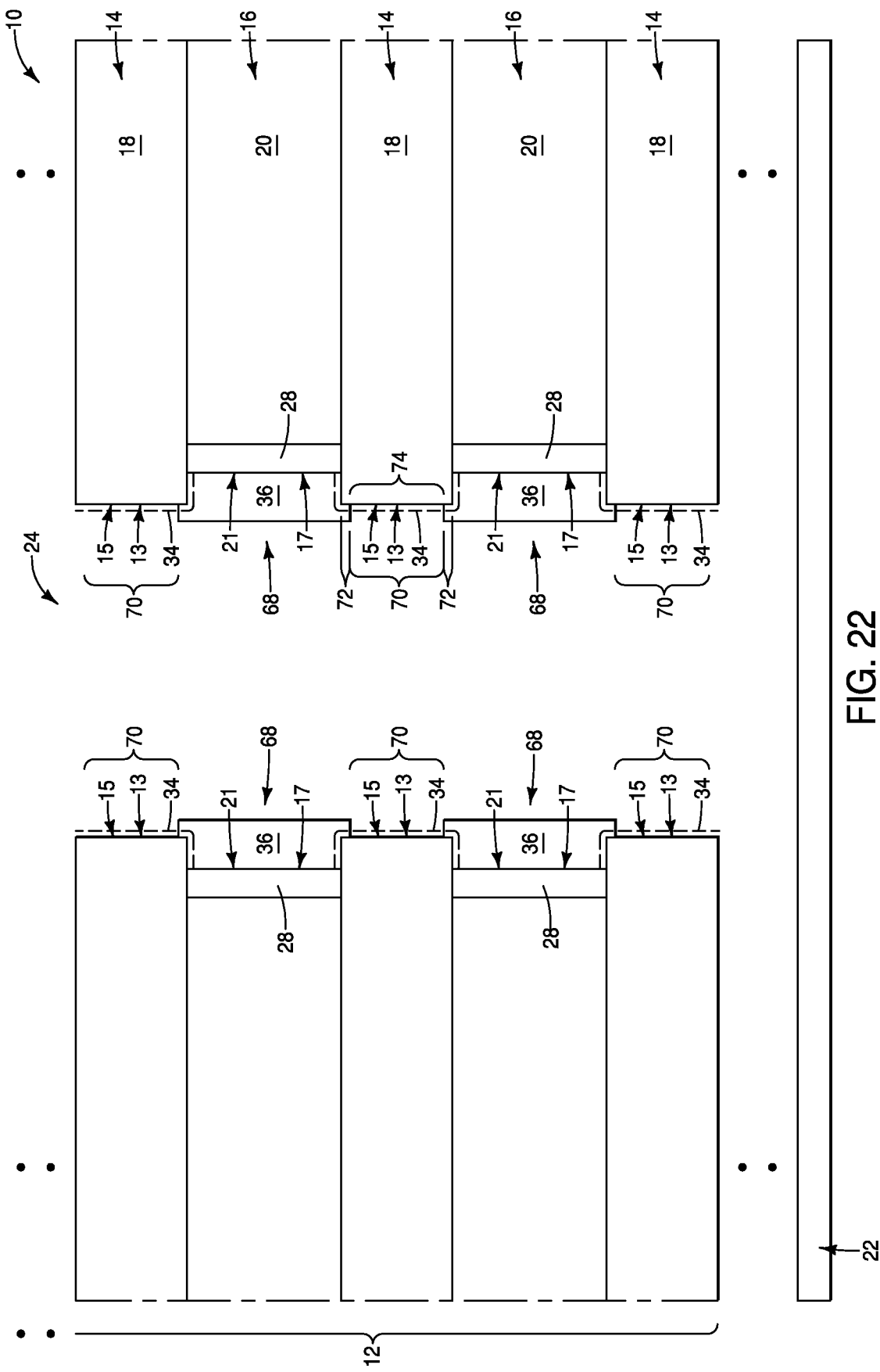

Referring to FIG. 22, charge-trapping material 36 is selectively deposited along the surfaces 17 relative to the coated surfaces 15.

The charge-trapping material 36 is configured as the segments 68 which are vertically spaced from one another by the intervening regions (i.e., gaps) 70. The charge-trapping material 36 extends along the vertical faces 21 (which may be referred as first vertical faces), and extends partially along the vertical faces 13 (which may be referred to as second vertical faces). In some embodiments, the charge-trapping material 36 may be considered to extend along a first surface area 72 of each of the vertical faces 15, and to not extend along a second surface area 74 of each of the vertical faces 15. A total surface area of each of the vertical faces is a sum of the first and second surface areas 72 and 74. In some embodiments, the first surface are 72 of a vertical face 15 is less than or equal to about 90% of the total surface area of the vertical face, less than or equal to about 50% of the total surface area, less than or equal to about 30% of the total surface area, or within a range of from about 10% of the total surface area to about 90% of the total surface area.

Figure 23:
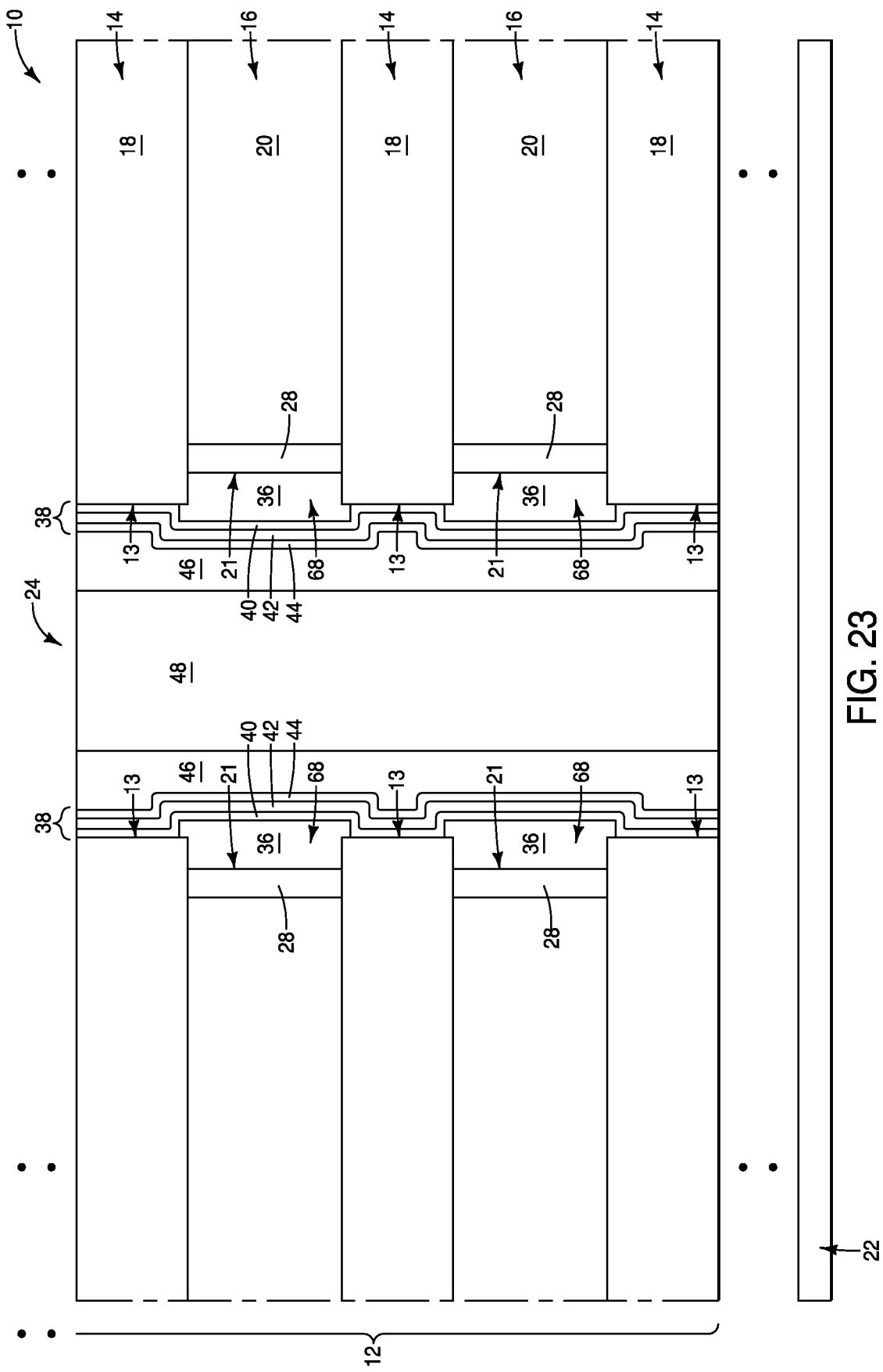

Referring to FIG. 23, the tunneling material 38 is formed to extend vertically along the first and second levels 14 and 16. The tunneling material includes the three compositions 40, 42 and 44. The tunneling material 38 extends along the segments 68 of the charge-trapping material 36, and extends across the intervening regions 70 (labeled in FIG. 22) between the segments 68.

The coating 34 (FIG. 22) is shown to be removed at the processing stage of FIG. 23. Such may result from oxidation of the coating during formation of the tunneling material 38. In other embodiments, some of the coating 34 may remain at the processing stage of FIG. 22. The tunneling material 38 is directly against the vertical faces 13 of the first levels 14 in the shown embodiment, and is spaced from the vertical faces 21 of the second levels 16 by the charge-trapping material 36.

The channel material 46 is formed within the opening 24 and along the tunneling material 38. In the illustrated embodiment, the channel material 46 is directly against the tunneling material 38, and extends vertically along the first and second levels 14 and 16. The channel material 46 lines a periphery of the opening 24. The insulative material 48 fills a remaining interior region of the opening 24.

Figure 24:
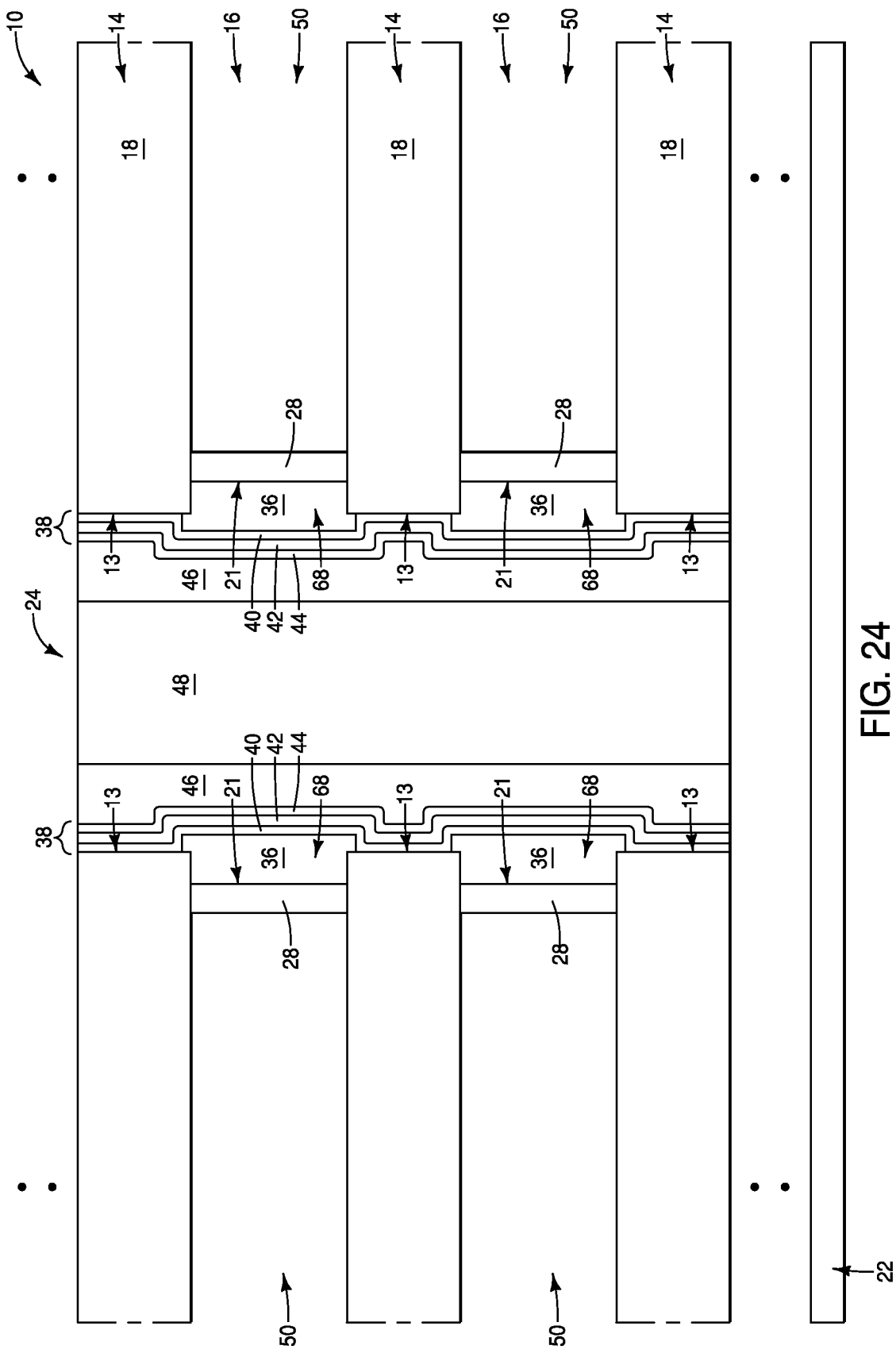

Referring to FIG. 24, the second material 20 (FIG. 23) is removed to leave the voids 50.

Figure 25:
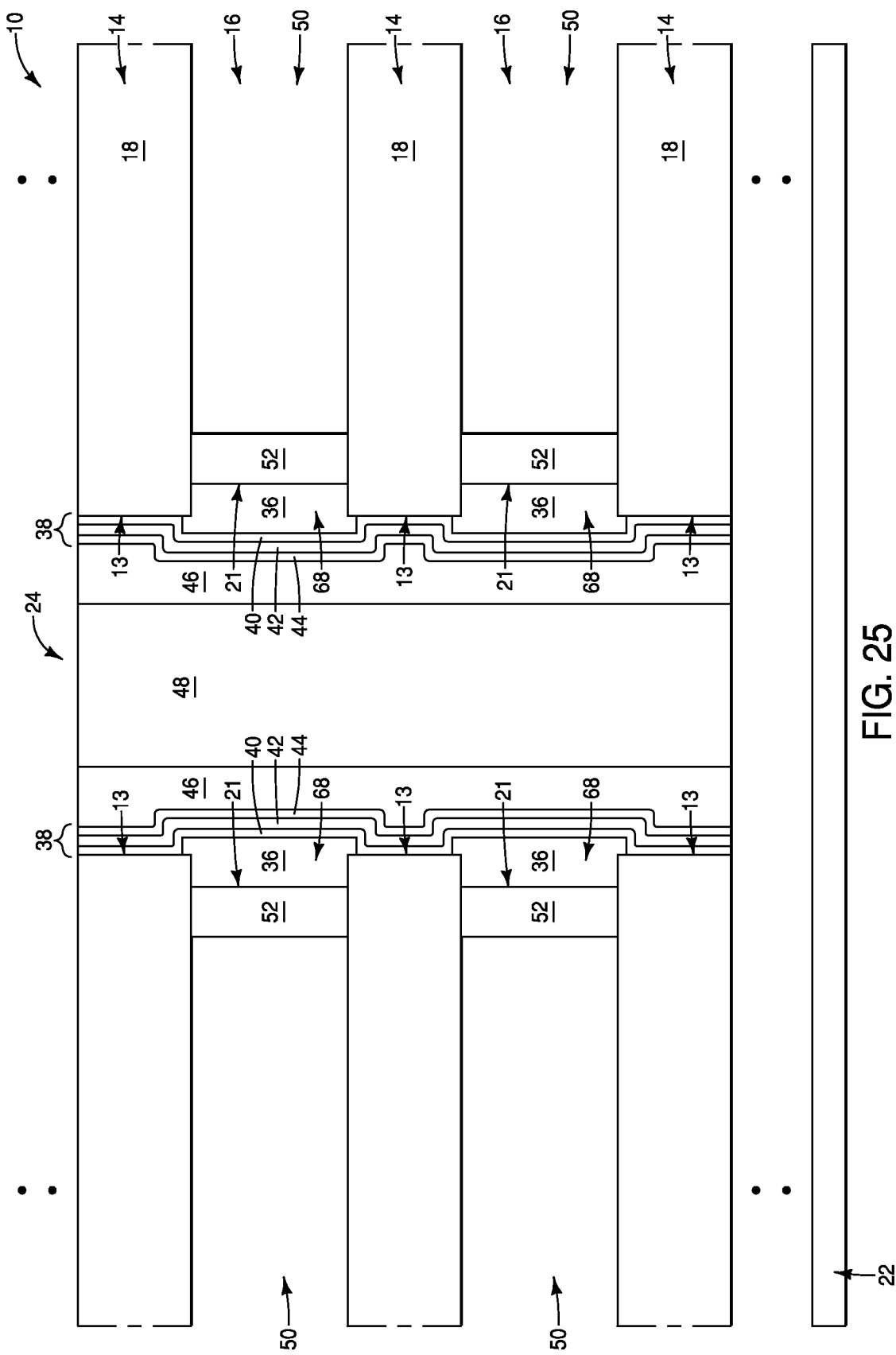

Referring to FIG. 25, the semiconductor material 28 (FIG. 24) is oxidized to form the charge-blocking dielectric material 52.

Figure 26:
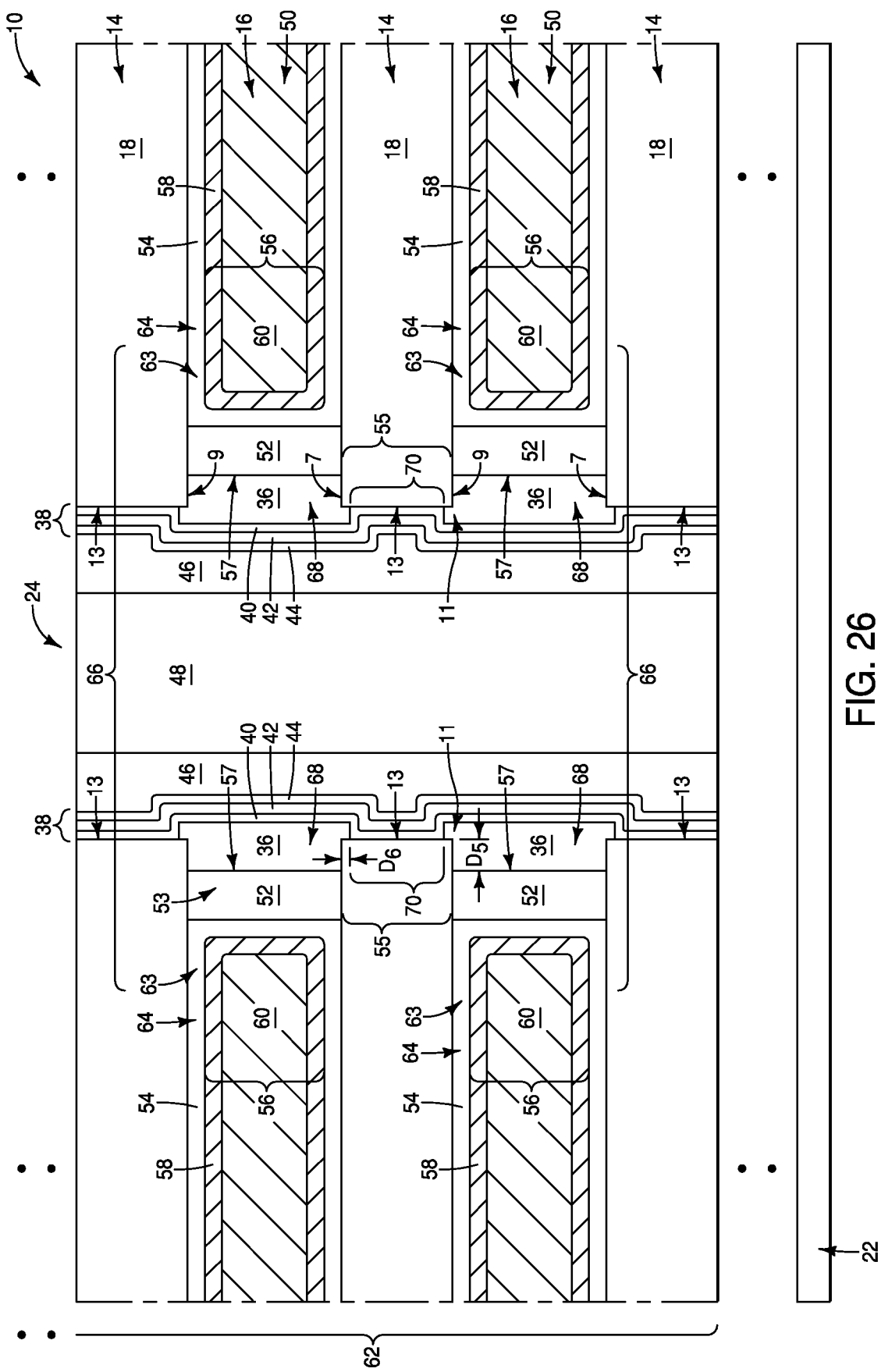

Referring to FIG. 26, the additional charge-blocking material 54 is formed within voids 50 to line the voids, and the conductive material 56 is formed within the lined voids. The conductive material 56 includes the outer layer 58 along the charge-blocking material 54, and includes the inner core region 60.

The construction 10 of FIG. 26 may be considered to comprise the vertical stack 62 of alternating conductive wordline levels 16 and insulative levels 14. The conductive wordline levels have the terminal ends 63, and the charge blocking material 52 is adjacent such terminal ends. The wordline levels comprise gates 64 along the terminal ends 63. The gates are incorporated into memory cells (e.g., NAND memory cells) 66.

The charge-blocking material 52 is arranged as the vertically stacked segments 53 which are spaced from one another by the intervening regions (i.e., gaps) 55. The segments 53 have the vertical faces (edges) 57 which are laterally outward of the conductive terminal ends 63. In some embodiments, each of the segments 53 of the charge-blocking material 52 may be considered to be associated with a wordline level 16 (i.e., is within one of the wordline levels). Each vertical face 57 of the segments 53 may thus also be considered to be associated with a wordline level 16. Further, each of the segments 52 may be considered to be associated with a conductive terminal end 63 which is directly against the segment 52 (or, alternatively considered, which is immediately neighboring the segment 52). The vertical faces 57 of the segments 52 are in opposing relation to the conductive terminal ends 63 associated with the segments 52.

The insulative levels 14 have terminal ends with the vertical faces 13. The vertical faces 13 are laterally offset from the vertical faces 57, and in the shown embodiment may be considered to be laterally outward of the vertical faces 57.

In some embodiments, the insulative levels 14 may be considered to be within the regions 55 between the segments 53 of the charge-blocking material 52. The terminal regions of the insulative levels 14 may be considered to comprise the projections 11, with such projections extending laterally outward of the vertical faces 57. The projections 11 comprise the upper surfaces 7, the lower surfaces 9, and the vertical faces 13. The projections 11 project laterally outwardly beyond the vertical faces 57 of the charge-blocking material 52 by a dimension $D_5$ which corresponds to a lateral offset between the vertical faces 57 and the vertical faces 13. In some embodiments, the dimension $D_5$ may be within a range of from about 10 Å to about 250 Å.

The charge-trapping material 36 is along the vertical faces 57, and is partially along vertical faces 13. In the shown embodiment, the charge-trapping material 36 wraps partially around the projections 11. The charge-trapping material overlaps a dimension $D_6$ along corners of the projections 11 along the cross-section of FIG. 26. The dimension $D_6$ may be any suitable amount, and in some embodiments may be within a range of from about 10 Å to about 100 Å.

The charge-trapping material 36 is configured as the segments 68 which are vertically spaced from one another by the intervening gaps (regions) 70. The gaps 70 extend to the vertical faces 13 along the insulative material 18. In the shown embodiment, the charge-tunneling material 38 and the channel material 46 extend into the gaps 70.

Figure 27:
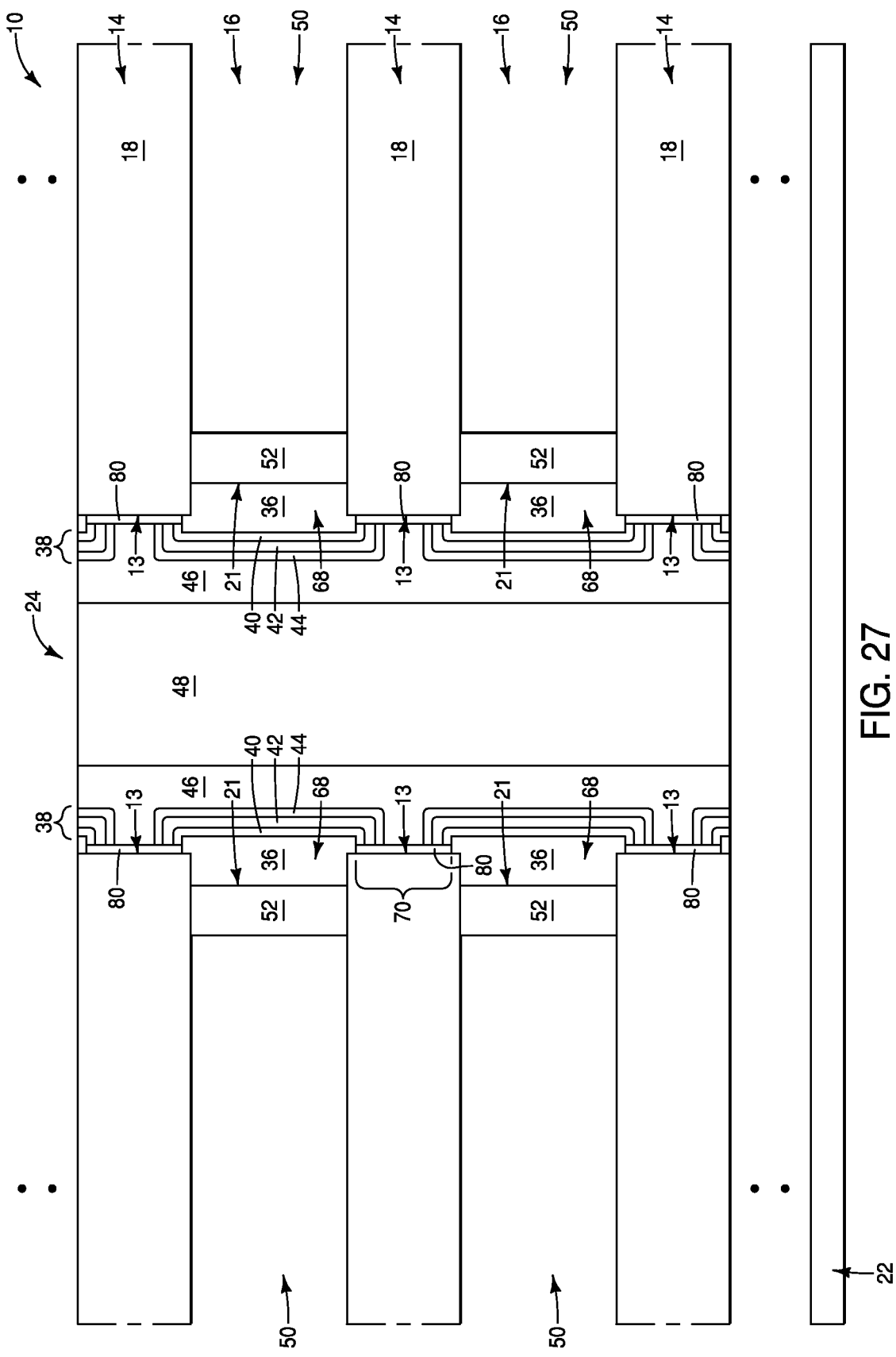
FIGS. 27 and 28 are diagrammatic cross-sectional side views of a region of an integrated assembly at example process stages of an example method for forming an example structure. The process stage of FIG. 27 may follow that of FIG. 25.
Figure 28:
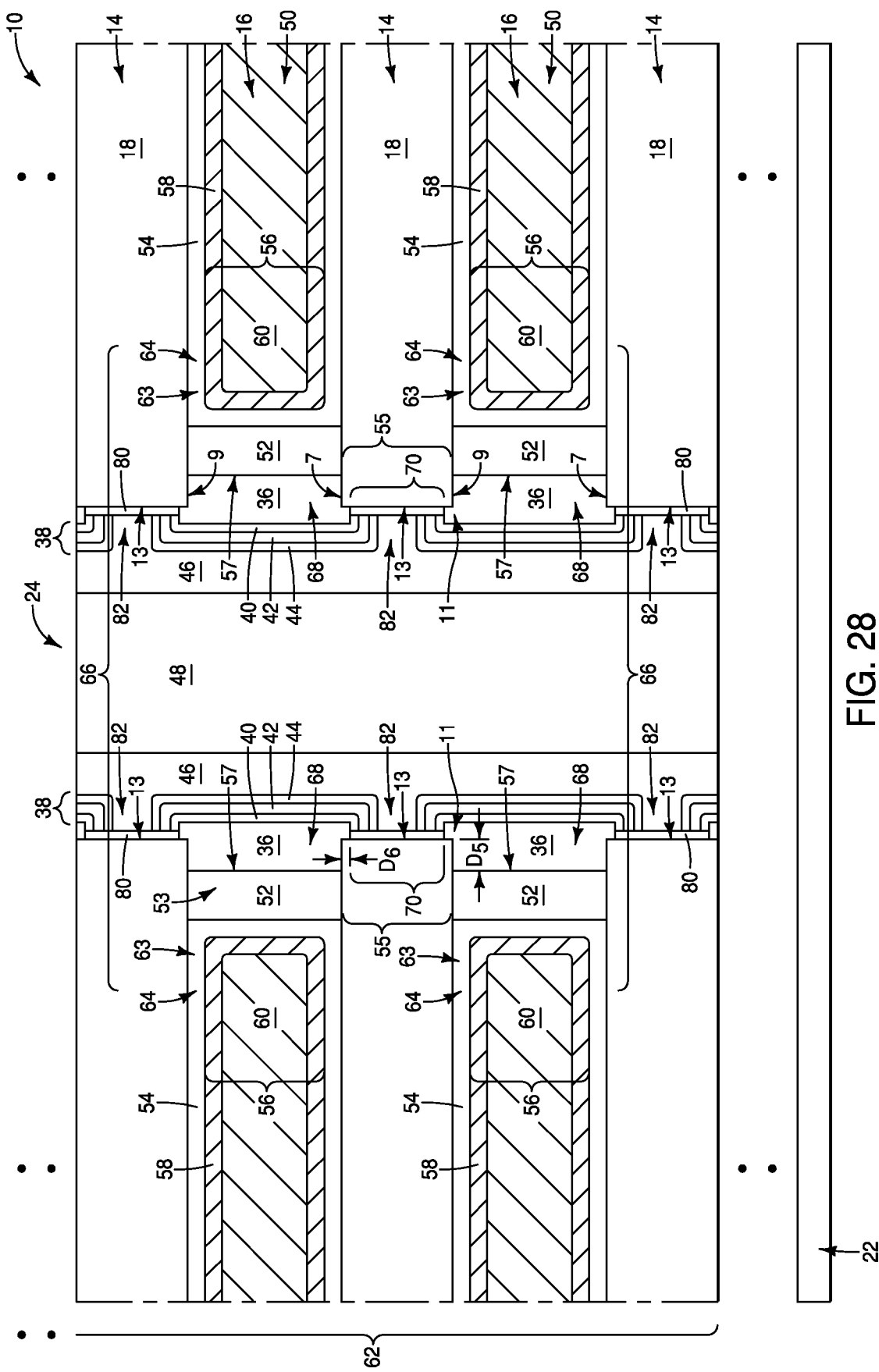

In the embodiment of FIG. 26, the tunneling material 38 wraps around the segments 68 of the charge-trapping material 36, and extends into the intervening regions (gaps) 70 between the vertically-neighboring segments 68. Such may advantageously provide shielding between vertically-neighboring segments 68 which may assist in precluding undesired disturb mechanisms between the vertically-neighboring segments. As discussed above, the tunneling material 38 may comprise one or both of silicon nitride or silicon oxynitride (for instance, the middle composition 42 may comprise one or both of silicon nitride or silicon oxynitride). Such may be a charge-trapping material, and may provide tunneling material 38 with charge-trapping properties. In some embodiments, the charge-trapping properties of the tunneling material 38 may be problematic to the extent that the tunneling material extends across the intervening regions 70; in that such may provide a mechanism for charge to undesirably transfer between vertically adjacent memory cells. FIGS. 27 and 28 describe a process which may be utilized to eliminate, or at least substantially reduce, charge-trapping properties of the tunneling material 38 within the intervening regions 70.

Referring to FIG. 27, the construction 10 is shown at a processing stage which may follow that of FIG. 25. The oxidant utilized to oxidize the semiconductor material 28 (FIG. 24) penetrates through the material 18 (e.g., silicon dioxide) of levels 14 and oxidizes at least some of the charge-tunneling material 38 to form an oxide 80 within the intervening regions 70. The oxide 80 may include nitrogen from the silicon nitride and/or silicon oxynitride of the charge-tunneling material 38, but charge-trapping properties associated with such nitrogen are substantially more diluted in the oxide 80 as compared to the charge-trapping properties associated with the silicon nitride and/or silicon oxynitride of the charge-trapping material 38.

FIG. 28 shows the construction of FIG. 27 incorporated into an integrated assembly analogous to that described above with reference to FIG. 26. The assembly of FIG. 28 is similar to that of FIG. 26 except that the charge-tunneling material 38 does not extend entirely across the intervening regions (gaps) 70 in the assembly of FIG. 28 (i.e., there are discontinuities 82 formed along the vertical expanses of the charge-tunneling material 38). In some embodiments, one or more compositions of the charge-tunneling material 38 may extend across the intervening regions 70, but at least any compositions comprising silicon nitride or silicon oxynitride (the middle composition 42 in the shown embodiment) do not extend entirely across the intervening regions 70.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array having a vertical stack of alternating insulative levels and wordline levels. The wordline levels include conductive wordline material having terminal ends. Charge blocking material is along the terminal ends of the conductive wordline material and has first vertical faces laterally outward of the terminal ends of the conductive wordline material. The insulative levels have terminal ends with second vertical faces. The second vertical faces are laterally offset relative to the first vertical faces. Charge-trapping material is along the first vertical faces, and extends partially along the second vertical faces. The charge-trapping material is configured as segments which are arranged one atop another, and which are vertically spaced from one another by intervening gaps which extend to the second vertical faces. Charge-tunneling material extends along the segments of the charge-trapping material. Channel material extends vertically along the stack, and is spaced from the charge-trapping material by the charge-tunneling material. The channel material extends into the intervening gaps between the segments of the charge-trapping material.

Some embodiments include a memory array having a vertical stack of alternating insulative levels and wordline levels. The wordline levels have conductive terminal ends corresponding to control gate regions, and have charge-blocking material laterally outward of the conductive terminal ends. The charge-blocking material is configured as segments. The segments of the charge-blocking material are arranged one atop another and are vertically spaced from one another by first intervening gaps. The insulative levels are within said first intervening gaps. Each of the segments of the charge-blocking material has a vertical edge in opposing relation to an associated conductive terminal end of an associated wordline level. The vertical edges of the segments of the charge-blocking material are first vertical edges. Terminal regions of the insulative levels include projections which extend laterally outward of the first vertical edges. The projections have upper surfaces, lower surfaces and second vertical edges which extend between the upper and lower surfaces. Charge-trapping material is along the first vertical edges, and wraps partially around the projections. The charge-trapping material is configured as segments which are arranged one atop another, and which are vertically spaced from one another by second intervening gaps. Charge-tunneling material extends vertically along the stack. The charge-tunneling material extends along the segments of the charge-trapping material, and some of the charge-tunneling material extends into the second intervening gaps and along the second vertical edges. Channel material extends vertically along the charge-tunneling material.

Some embodiments include a memory array having a vertical stack of alternating insulative levels and wordline levels. The wordline levels have conductive terminal ends corresponding to control gate regions. A charge-blocking material is laterally outward of the conductive terminal ends. The charge-blocking material is configured as segments. The segments of the charge-blocking material are arranged one atop another and are vertically spaced from one another by first intervening gaps. Each of the segments of the charge-blocking material has a vertical edge in opposing relation to an associated conductive terminal end of an associated wordline level. The vertical edges of the segments of the charge-blocking material are first vertical edges. A charge-trapping material is configured as segments which are arranged one atop another, and which are vertically spaced from one another by second intervening gaps. A charge-tunneling material extends vertically along the stack. The charge-tunneling material extends along the segments of the charge-trapping material. A channel material extends vertically along the charge-tunneling material and into the second intervening gaps Some embodiments include a method of forming an integrated assembly. A vertical stack of alternating first and second levels is formed. The first levels comprise silicon dioxide, and the second levels comprise silicon nitride laterally capped with silicon. The first and second levels have exposed first and second surfaces, respectively, along an opening extending through the first and second levels. The first surfaces comprise the silicon dioxide, and the second surfaces comprise the silicon. The first surfaces comprise OH-moieties and the second surfaces substantially lack the OH-moieties. The first surfaces are coated with a hindering material, utilizing precursor which reacts with the OH-moieties. Charge-trapping material is selectively formed along the second surfaces relative to the coated first surfaces. Charge-tunneling material is formed to extend vertically along the first and second levels. The charge-tunneling material is spaced from the second levels by the charge-trapping material. Channel material is formed to extend vertically along the charge-tunneling material. The silicon nitride of the second levels is removed to leave voids. Conductive mati formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array, comprising:
    a vertical stack of alternating insulative levels and wordline levels, the wordline levels comprising conductive wordline material having terminal ends; a charge blocking material being along the terminal ends of the conductive wordline material and having first vertical faces laterally outward of the terminal ends of the conductive wordline material; the insulative levels having terminal ends with second vertical faces; the second vertical faces being laterally offset relative to the first vertical faces; and
    a charge-trapping material along the first vertical faces, and extending partially along the second vertical faces; the charge-trapping material being configured as segments which are arranged one atop another, and which are vertically spaced from one another by intervening gaps which extend to the second vertical faces.

2. The memory array of claim 1 further comprising a charge-tunneling material extending along the segments of the charge-trapping material.

3. The memory array of claim 1 further comprising a channel material extending vertically along the stack and extending into the intervening gaps between the segments of the charge-trapping material.

4. The memory array of claim 1 wherein the charge-trapping material extends along a first surface area of the second vertical faces; and wherein said first surface area is less than or equal to about 90% of a total surface area of the second vertical faces.

5. The memory array of claim 1 wherein the second vertical faces are laterally outward of the first vertical faces.

6. The memory array of claim 1 wherein the charge-blocking material includes silicon dioxide; and wherein the first vertical faces are along the silicon dioxide.

7. The memory array of claim 1 wherein the insulative levels include silicon dioxide; and wherein the second vertical faces are along the silicon dioxide.

8. A memory array, comprising a vertical stack of alternating insulative levels and wordline levels, the wordline levels having conductive terminal ends corresponding to control gate regions, and having a charge-blocking material laterally outward of the conductive terminal ends; the charge-blocking material being configured as segments; the segments of the charge-blocking material being arranged one atop another and being vertically spaced from one another by first intervening gaps, with the insulative levels being within said first intervening gaps; each of the segments of the charge-blocking material having a vertical edge in opposing relation to an associated conductive terminal end of an associated wordline level; the vertical edges of the segments of the charge-blocking material being first vertical edges; terminal regions of the insulative levels including projections which extend laterally outward of the first vertical edges; the projections having upper surfaces, lower surfaces and second vertical edges which extend between the upper and lower surfaces; and
    a charge-trapping material along the first vertical edge, the charge-trapping material contacting upper and lower surfaces of the projections and extending laterally outward of the second vertical edges.

9. The memory array of claim 8 wherein the charge-trapping material wraps partially around the projections; the charge-trapping material being configured as segments which are arranged one atop another, and which are vertically spaced from one another by second intervening gaps.

10. The memory array of claim 9 further comprising a charge-tunneling material extending vertically along the stack and extending into the second intervening gaps and along the second vertical edges; and
    a channel material extending vertically along the charge-tunneling material.

11. The memory array of claim 10 wherein the charge-tunneling material includes a middle composition between a pair of outer compositions; wherein the outer compositions comprise silicon dioxide; and wherein the middle composition comprises one or both of silicon nitride and silicon oxynitride.

12. The memory array of claim 11 wherein the middle composition extends entirely across the second intervening gaps.

13. The memory array of claim 11 wherein the middle composition does not extend entirely across the second intervening gaps.

14. The memory array of claim 10 wherein the channel material extends into the second intervening gaps.

15. The memory array of claim 8 wherein the charge-blocking material includes silicon dioxide and aluminum oxide; and wherein the first vertical edges are along the silicon dioxide.

16. A method of forming an integrated assembly, comprising:
    forming a vertical stack of alternating first and second levels; the first levels comprising silicon dioxide, and the second levels comprising silicon nitride laterally capped with silicon; the first and second levels having exposed first and second surfaces, respectively, along an opening extending through the first and second levels; the first surfaces comprising the silicon dioxide, and the second surfaces comprising the silicon; the first surfaces comprising OH-moieties and the second surfaces substantially lacking the OH-moieties;

coating the first surfaces with a hindering material, utilizing precursor which reacts with the OH-moieties;

selectively forming charge-trapping material along the second surfaces relative to the coated first surfaces.

17. The method of claim 16 further comprising forming charge-tunneling material extending vertically along the first and second levels, and spaced from the second levels by the charge-trapping material.

18. The method of claim 16 further comprising:

removing the silicon nitride of the second levels to leave voids; and forming conductive material within the voids.

19. The method of claim 18 further comprising lining the voids with aluminum oxide, and subsequently forming the conductive material within the lined voids.

20. The method of claim 16 wherein the charge-trapping material becomes segments vertically-spaced from one another by intervening regions.

\* \* \* \* \*